(12) United States Patent
Fukano

(10) Patent No.: US 8,295,070 B2
(45) Date of Patent: Oct. 23, 2012

(54) RESISTANCE CHANGE MEMORY

(75) Inventor: Gou Fukano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 12/968,914

(22) Filed: Dec. 15, 2010

(65) Prior Publication Data

US 2011/0164444 A1 Jul. 7, 2011

(30) Foreign Application Priority Data

Jan. 6, 2010 (JP) ................................. 2010-001500

(51) Int. Cl.
*G11C 5/02* (2006.01)

(52) U.S. Cl. .......................................... 365/51; 365/158

(58) Field of Classification Search .................... 365/51, 365/158

See application file for complete search history.

(56) References Cited

U.S. PATENT DOCUMENTS

| | | | | |
|---|---|---|---|---|
| 2004/0183649 A1* | 9/2004 | Ikeda | ............................. | 338/162 |
| 2008/0164056 A1* | 7/2008 | Gettemy et al. | ............. | 174/260 |
| 2009/0029675 A1* | 1/2009 | Steinmetz et al. | ............ | 455/410 |
| 2009/0135637 A1 | 5/2009 | Takase | | |
| 2010/0091551 A1 | 4/2010 | Hosono et al. | | |
| 2010/0124097 A1 | 5/2010 | Takase | | |

OTHER PUBLICATIONS

U.S. Appl. No. 12/869,049, filed Aug. 26, 2010, Gou Fukano.

* cited by examiner

*Primary Examiner* — Michael Tran

(74) *Attorney, Agent, or Firm* — Oblon, Spivak, McClelland, Maier & Neustadt, L.L.P.

(57) ABSTRACT

According to one embodiment, a resistance change memory includes a stacked layer structure stacked on a semiconductor substrate in order of a first conductive line, a first variable resistance element, a second conductive line, a second variable resistance element, . . . a n-th conductive line, a n-th variable resistance element and a (n+1)-th conductive line, where n is a natural number equal to or larger than 2, and a first to a n-th drivers which drives the first to the (n+1)-th conductive lines. The odd-numbered conductive lines are extends in a first direction along a surface of the semiconductor substrate. The even-numbered conductive lines are extends in a second direction along the surface of the semiconductor substrate. Sizes of the first to (n+1)-th drivers become large gradually from the first driver to the (n+1)-th driver.

18 Claims, 23 Drawing Sheets

| Via | Time constant $\tau$ | Driver size |
|---|---|---|
| ZIA2 | Small | Small |
| ZIA4 | ↕ | ↕ |
| ⋮ | Big | Big |

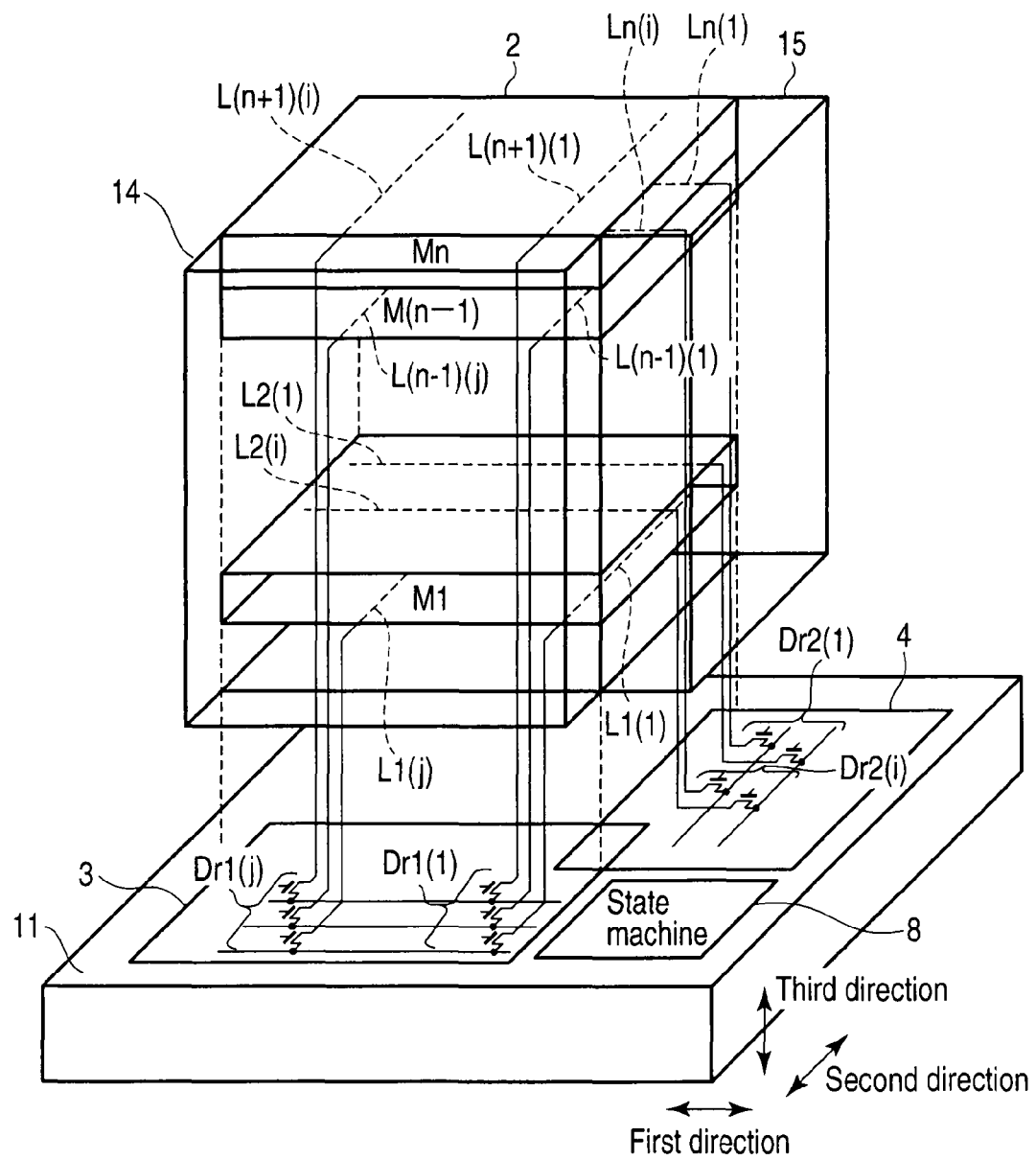
F I G. 4

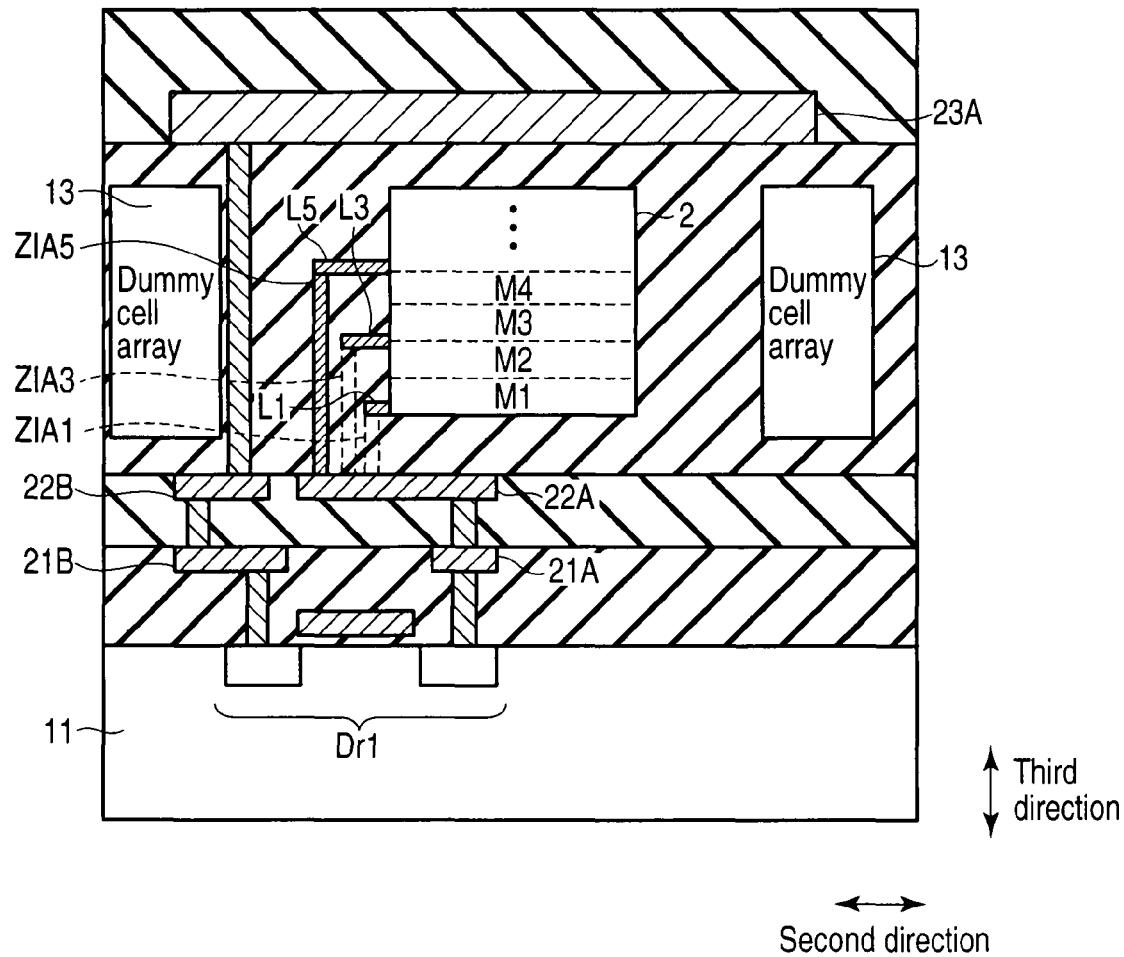
F I G. 7

| Via | Time constant τ | Driver size |
|---|---|---|
| ZIA1<br>ZIA2<br>ZIA3<br>ZIA4<br>ZIA5<br>⋮<br>ZIA(n+1) | Small<br>↕<br>Big | Small<br>↕<br>Big |

FIG. 11

| Via | Time constant τ | Driver size |
|---|---|---|
| ZIA1<br>ZIA3<br>ZIA5<br>⋮ | Small<br>↕<br>Big | Small<br>↕<br>Big |

FIG. 12

| Via | Time constant $\tau$ | Driver size |
|---|---|---|
| ZIA2<br>ZIA4<br>⋮ | Small<br>↕<br>Big | Small<br>↕<br>Big |

F I G. 1 3

| Via | Structure | Time constant $\tau$ | Driver size |
|---|---|---|---|
| ZIA1 | 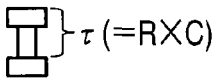 $\tau (= R \times C)$ | $1 \times \tau$ | 1 (Reference value) |
| ZIA2 | 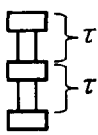 $\tau$ $\tau$ | $2^2 \times \tau$ | 2 |
| ZIA3 | 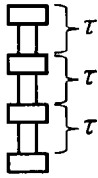 $\tau$ $\tau$ $\tau$ | $3^2 \times \tau$ | 3 |
| ZIA4 | 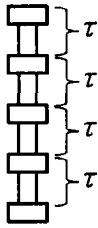 $\tau$ $\tau$ $\tau$ $\tau$ | $4^2 \times \tau$ | 4 |
| ⋮ | ⋮ | ⋮ | ⋮ |
| ZIA(n+1) | 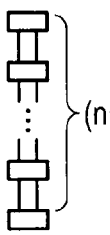 $(n+1) \times \tau$ | $(n+1)^2 \times \tau$ | n+1 |
F I G. 14

| Via | Structure | Time constant $\tau$ | Driver size |
|---|---|---|---|
| ZIA1 | 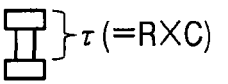 $\tau$ (=R×C) | $1 \times \tau$ | 1(Reference value) |
| ZIA3 | 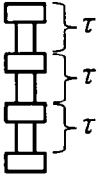 $\tau$ $\tau$ $\tau$ | $3^2 \times \tau$ | 3 |
| ZIA5 | 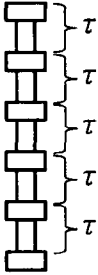 $\tau$ $\tau$ $\tau$ $\tau$ $\tau$ | $5^2 \times \tau$ | 5 |
| ⋮ | ⋮ | ⋮ | ⋮ |
F I G. 15

| Via | Structure | Time constant $\tau$ | Driver size |
|---|---|---|---|
| ZIA2 | 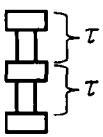 | $2^2 \times \tau$ | 2 |
| ZIA4 | 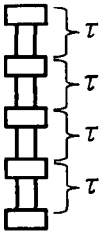 | $4^2 \times \tau$ | 4 |
| ⋮ | ⋮ | ⋮ | ⋮ |
F I G. 16

RESISTANCE CHANGE MEMORY

CROSS-REFERENCE TO RELATED APPLICATIONS

This application is based upon and claims the benefit of priority from Japanese Patent Application No. 2010-001500, filed Jan. 6, 2010; the entire contents of which are incorporated herein by reference.

FIELD

Embodiments described herein relate generally to a peripheral circuit of a resistance change memory.

BACKGROUND

A resistance change memory is a semiconductor memory using a variable resistance element as a recording medium. The variable resistance element is an element made of a material that changes its resistance value in accordance with, e.g., a voltage, electric current, or heat, and includes a phase change element. For example, a ReRAM (Resistance Random Access Memory) using a metal oxide as a variable resistance element is expected as a next-generation semiconductor memory having a large capacity and capable of a high-speed operation.

The capacity can be increased by, e.g., giving a three-dimensional structure to a memory cell array, or storing multi-level data in the variable resistance element. A resistance change memory adopts a cross-point type memory cell array, and hence is suited to construction of a three-dimensional structure by stacking memory cell arrays (see, e.g., patent reference 1).

Presently, however, it is difficult to give a three-dimensional structure to a peripheral circuit even when a three-dimensional memory cell array is possible. Accordingly, the number of stackable memory cell arrays is limited by the size of the formation region of drivers for driving conductive lines in these memory cell arrays. That is, the number of drivers is proportional to the number of memory cell arrays, whereas it is impossible to unlimitedly enlarge the driver formation region on a semiconductor substrate.

Also, when stacking memory cell arrays, the time constant of a via plug for connecting a conductive line in a memory cell array and a driver for driving the conductive line changes from one memory cell array to another. On the other hand, the size (channel width) of an FET (Field Effect Transistor) as a driver is constant. Therefore, based on the time constant (maximum value) of a via plug for connecting a conductive line (uppermost conductive line) in an uppermost memory cell array and a driver for driving the conductive line, the size of all drivers is set to a size enough to drive the uppermost conductive line.

From the foregoing, it is conventionally necessary to form drivers having a large uniform size in a limited region. This makes it impossible to sufficiently obtain the benefit of a large capacity of a three-dimensional memory cell array.

BRIEF DESCRIPTION OF THE DRAWINGS

FIGS. 4 and 5 show a memory cell array and a peripheral circuit.
FIG. 7 is a cross-sectional view along VII-VII line in FIG. 6.
FIGS. 11 to 16 show a driver size.

DETAILED DESCRIPTION

In general, according to one embodiment, a resistance change memory comprising: a semiconductor substrate; a stacked layer structure stacked on the semiconductor substrate in order of a first conductive line, a first variable resistance element, a second conductive line, a second variable resistance element, ... a n-th conductive line, a n-th variable resistance element and a (n+1)-th conductive line, where n is a natural number equal to or larger than 2; and a first to a n-th drivers which drives the first to the (n+1)-th conductive lines, wherein the odd-numbered conductive lines from the semiconductor substrate among the first to (n+1)-th conductive lines are extends in a first direction along a surface of the semiconductor substrate, the even-numbered conductive lines from the semiconductor substrate among the first to (n+1)-th conductive lines are extends in a second direction along the surface of the semiconductor substrate, and the first direction intersects with the second direction, wherein the g-th variable resistance element among the first to the n-th variable resistance elements is provided between the g-th conductive line and the (g+1)-th conductive line, where g is one of 1, 2, ... and n, wherein sizes of the first to (n+1)-th drivers become large gradually from the first driver to the (n+1)-th driver.

1. Basic Concept

Embodiments propose a technique of minimizing the enlargement of a driver formation region with respect to the increase in number of memory cell arrays to be stacked, in a resistance change memory adopting cross-point type memory cell arrays.

This technique changes the driver size, i.e., the size (channel width) of an FET as a driver in accordance with the position (layer) of a corresponding memory cell array, thereby minimizing the enlargement of a driver formation region with respect to the increase in number of memory cell arrays to be stacked.

More specifically, the driver size is increased as the position of a conductive line in a corresponding memory cell array is spaced apart from a semiconductor substrate. This is so because when stacking memory cell arrays, the time constant of a via plug for connecting a conductive line in a memory cell array and a driver for driving the conductive line gradually increases from the lowermost memory cell array toward the uppermost memory cell array.

This can make the size of a driver formation region smaller than that of a conventional memory using a uniform driver size. Accordingly, it is possible to sufficiently obtain the benefit of a large capacity of a three-dimensional memory cell array.

2. Resistance Change Memory

First, a resistance change memory to which the embodiments are applied will be explained.

(1) Overall View

Figure 1:
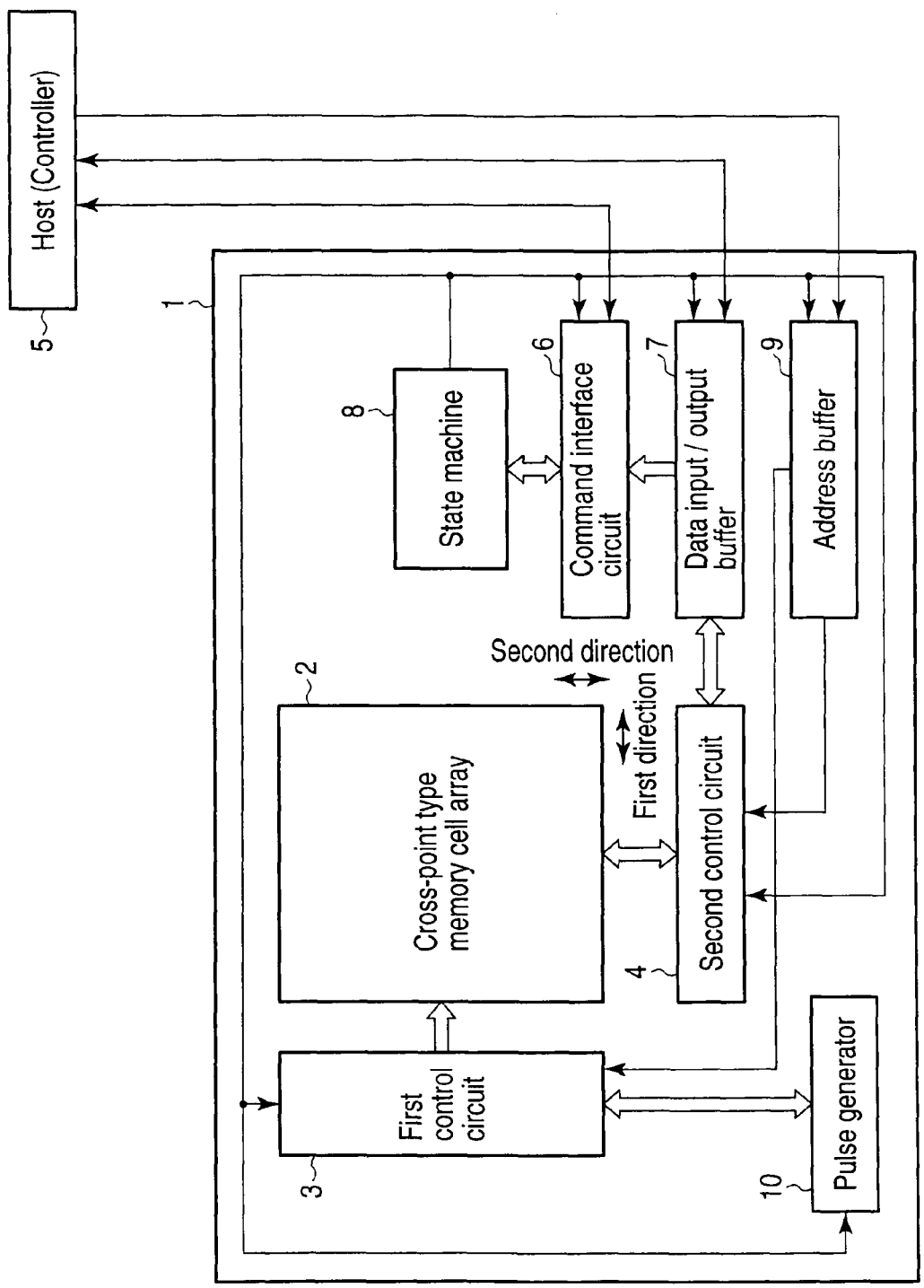
FIG. 1 shows a resistance change memory.

FIG. 1 shows the main parts of a resistance change memory.

Resistance change memory (e.g., chip) 1 includes cross-point type memory cell array 2. Cross-point type memory cell array 2 has a stacked structure including memory cell arrays.

First control circuit 3 is placed at one end in a first direction of cross-point type memory cell array 2, and second control circuit 4 is placed at one end in a second direction perpendicular to the first direction.

First and second control circuits 3 and 4 select one of the stacked memory cell arrays based on, e.g., a memory cell array selection signal.

First control circuit 3 selects, e.g., a row of cross-point type memory cell array 2 based on a row address signal. Second control circuit 4 selects, e.g., a column of cross-point type memory cell array 2 based on a column address signal.

First and second control circuits 3 and 4 control data writing/erasing/reading for memory elements in cross-point type memory cell array 2.

First and second control circuits 3 and 4 can perform data writing/erasing/reading for one of the stacked memory cell arrays, and can also perform data writing/erasing/reading for two or more or all of the stacked memory cell arrays at the same time.

In resistance change memory 1, writing is called, e.g., set, and erasing is called, e.g., reset. A resistance value in the set state need only be different from that in the reset state: it is not important whether the former is higher or lower than the latter.

Also, when one of resistance values can selectively be written in a set operation, it is possible to implement a multilevel resistance change memory in which each memory element stores multi-level data.

Controller 5 supplies a control signal and data to resistance change memory 1. The control signal is input to command interface circuit 6, and the data is input to data input/output buffer 7. Controller 5 can be placed in chip 1, and can also be placed in a host (computer) different form chip 1.

Based on the control signal, command interface circuit 6 determines whether the data from host 5 is command data. If the data is command data, command interface circuit 6 transfers the command data from data input/output buffer 7 to state machine 8.

Based on the command data, state machine 8 manages the operation of resistance change memory 1. For example, based on the command data from host 5, state machine 8 manages set/reset operations and a read operation.

Controller 5 can also receive status information managed by state machine 8, and determine the result of the operation of resistance change memory 1.

In the set/reset operations and read operation, controller 5 supplies an address signal to resistance change memory 1. The address signal includes, e.g., a memory cell array selection signal, row address signal, and column address signal.

The address signal is input to first and second control circuits 3 and 4 via address buffer 9.

Based on an instruction from state machine 8, pulse generator 10 outputs, at a predetermined timing, a voltage pulse or current pulse required for, e.g., the set/reset operations and read operation.

(2) Memory Cell Array

Figure 2:
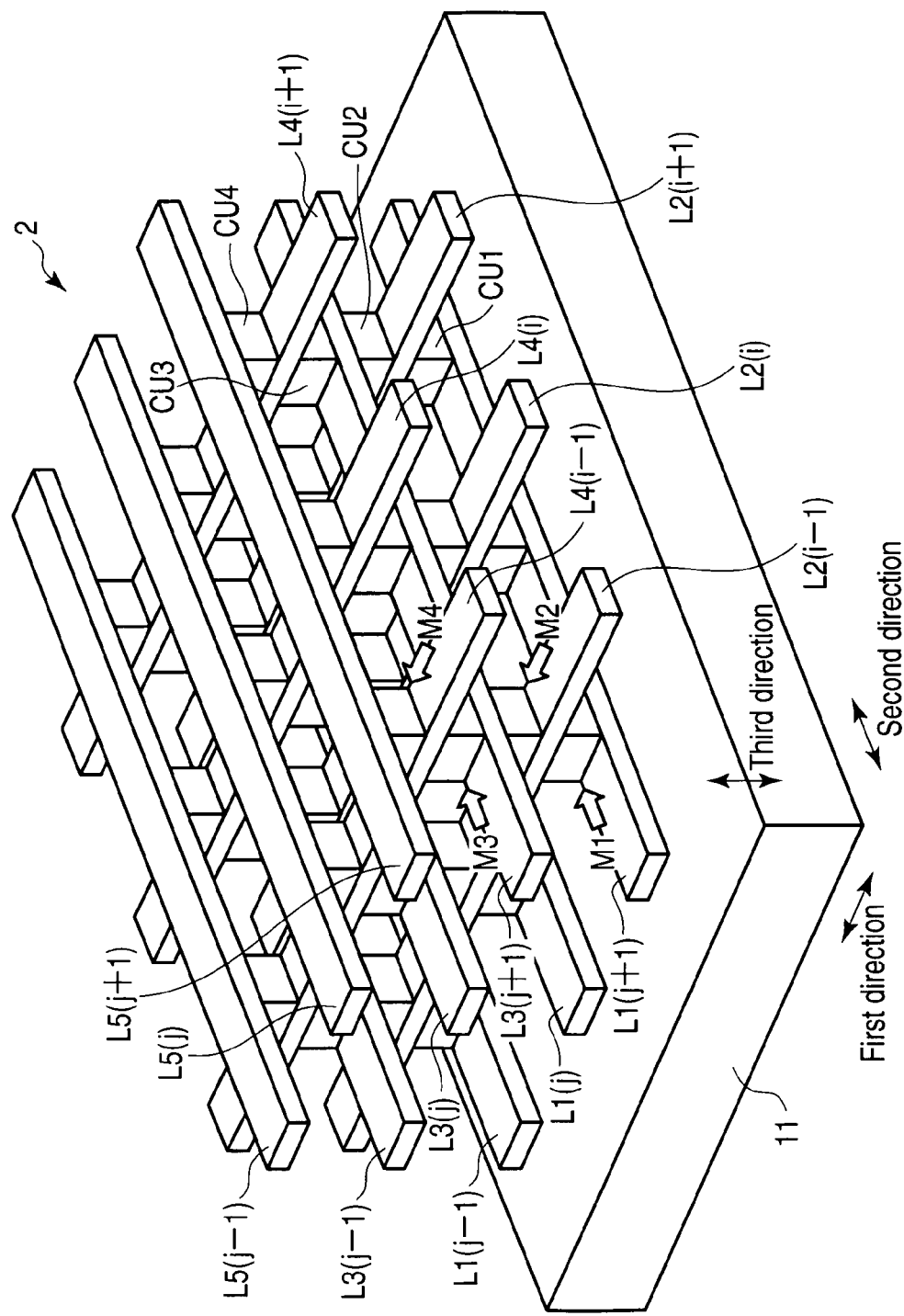
FIG. 2 shows a cross-point type memory cell array.

FIG. 2 shows cross-point type memory cell array.

Cross-point type memory cell array 2 is formed on semiconductor substrate (e.g., silicon substrate) 11. Note that circuit elements such as MOS transistors and an insulating film may be sandwiched between cross-point type memory cell array 2 and semiconductor substrate 11.

As an example, FIG. 2 shows cross-point type memory cell array 2 including four memory cell arrays M1, M2, M3, and M4 stacked in a third direction (a direction perpendicular to the major surface of semiconductor substrate 11). However, the number of memory cell arrays to be stacked need only be two or more.

Memory cell array M1 includes cell units CU1 arranged into an array in the first and second directions.

Similarly, memory cell array M2 includes cell units CU2 arranged into an array, memory cell array M3 includes cell units CU3 arranged into an array, and memory cell array M4 includes cell units CU4 arranged into an array.

Cell units CU1, CU2, CU3, and CU4 each include a memory element (variable resistance element) and rectifying element connected in series.

On semiconductor substrate 11, conductive lines $L1(j-1)$, $L1(j)$, and $L1(j+1)$, conductive lines $L2(i-1)$, $L2(i)$, and $L2(i+1)$, conductive lines $L3(j-1)$, $L3(j)$, and $L3(j+1)$, conductive lines $L4(i-1)$, $L4(i)$, and $L4(i+1)$, and conductive lines $L5(j-1)$, $L5(j)$, and $L5(j+1)$ are arranged in order from semiconductor substrate 11.

Conductive lines given odd numbers when counted from semiconductor substrate 11, i.e., conductive lines $L1(j-1)$, $L1(j)$, and $L1(j+1)$, conductive lines $L3(j-1)$, $L3(j)$, and $L3(j+1)$, and conductive lines $L5(j-1)$, $L5(j)$, and $L5(j+1)$ run in the second direction.

Conductive lines given even numbers when counted from semiconductor substrate 11, i.e., conductive lines $L2(i-1)$, $L2(i)$, and $L2(i+1)$, and conductive lines $L4(i-1)$, $L4(i)$, and $L4(i+1)$ run in the first direction.

These conductive lines each function as a word line or bit line.

First memory cell array M1 as the lowermost array is placed between first conductive lines $L1(j-1)$, $L1(j)$, and $L1(j+1)$ and second conductive lines $L2(i-1)$, $L2(i)$, and $L2(i+1)$. In set/reset operations and a read operation for memory cell array M1, conductive lines $L1(j-1)$, $L1(j)$, and $L1(j+1)$ and conductive lines $L2(i-1)$, $L2(i)$, and $L2(i+1)$ respectively function as word lines and bit lines or vice versa.

Second memory cell array M2 is placed between second conductive lines $L2(i-1)$, $L2(i)$, and $L2(i+1)$ and third conductive lines $L3(j-1)$, $L3(j)$, and $L3(j+1)$. In set/reset operations and a read operation for memory cell array M2, conductive lines $L2(i-1)$, $L2(i)$, and $L2(i+1)$ and third conductive lines $L3(j-1)$, $L3(j)$, and $L3(j+1)$ respectively function as word lines and bit lines or vice versa.

Third memory cell array M3 is placed between third conductive lines $L3(j-1)$, $L3(j)$, and $L3(j+1)$ and fourth conductive lines $L4(i-1)$, $L4(i)$, and $L4(i+1)$. In set/reset operations and a read operation for memory cell array M3, conductive lines $L3(j-1)$, $L3(j)$, and $L3(j+1)$ and conductive lines $L4(i-1)$, $L4(i)$, and $L4(i+1)$ respectively function as word lines and bit lines or vice versa.

Fourth memory cell array M4 is placed between fourth conductive lines $L4(i-1)$, $L4(i)$, and $L4(i+1)$ and fifth conductive lines $L5(j-1)$, $L5(j)$, and $L5(j+1)$. In set/reset operations and a read operation for memory cell array M4, conductive lines $L4(i-1)$, $L4(i)$, and $L4(i+1)$ and conductive lines $L5(j-1)$, $L5(j)$, and $L5(j+1)$ respectively function as word lines and bit lines or vice versa.

(3) Cell Unit

Figure 3:
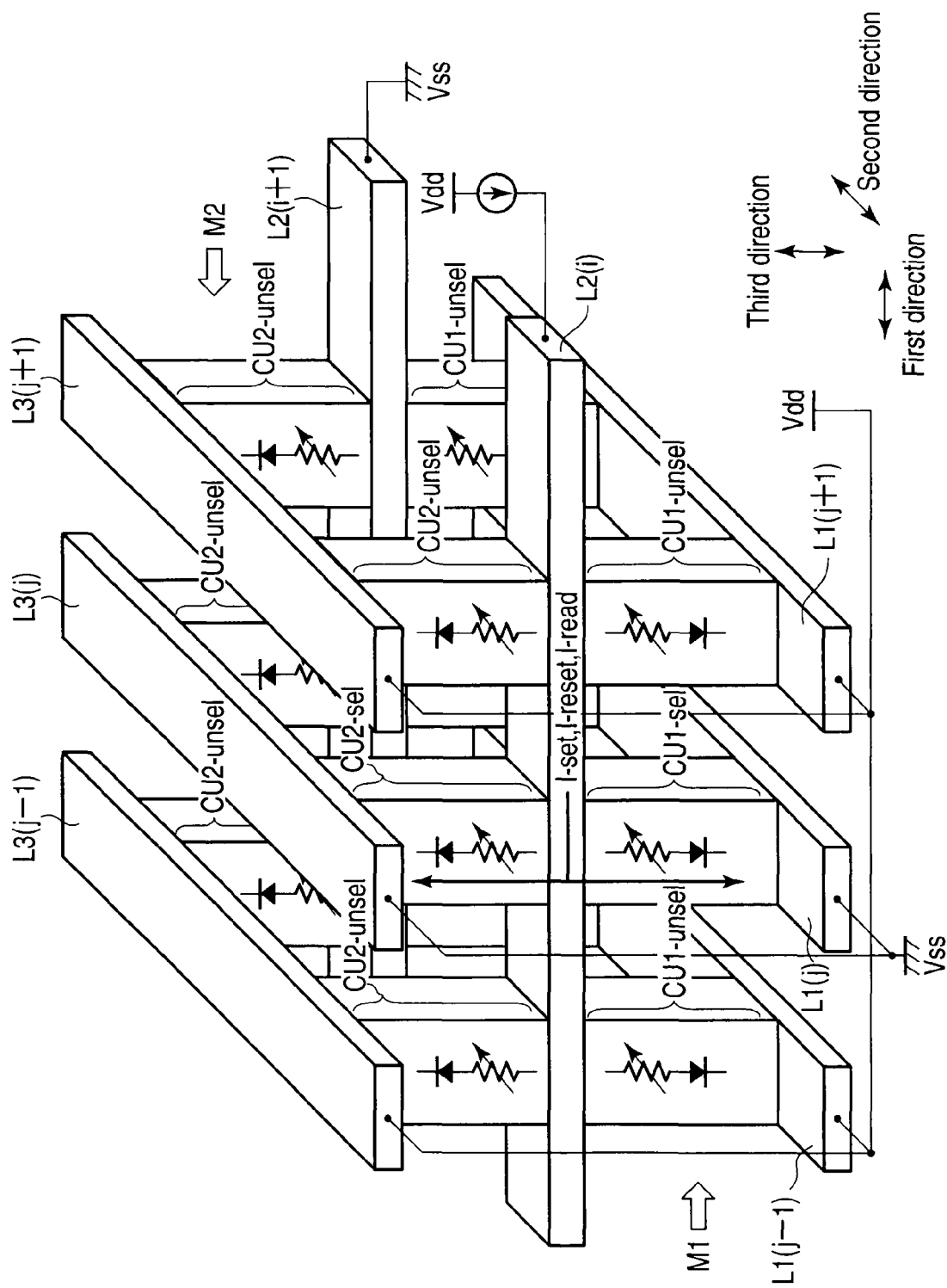
FIG. 3 shows a cell unit.

FIG. 3 shows cell units in two memory cell arrays.

For example, FIG. 3 shows cell units CU1 and CU2 in two memory cell arrays M1 and M2 shown in FIG. 2. The configuration of the cell units in two memory cell arrays M3 and M4 shown in FIG. 2 is the same as that of the cell units in two memory cell arrays M1 and M2 shown in FIG. 2.

Cell units CU1 and CU2 each include a memory element (variable resistance element) and rectifying element connected in series.

The connection relationship between the memory element and rectifying element has various patterns.

All cell units in one memory cell array, however, must have the same connection relationship between the memory element and rectifying element.

(4) Operations

The operations of the above-described resistance change memory will be explained below with reference to FIG. 3.

Memory cell array M1 is equivalent to memory cell array M1 shown in FIG. 2, and memory cell array M2 is equivalent to memory cell array M2 shown in FIG. 2.

A. Set Operation

First, a write (set) operation performed for selected cell unit CU1-sel in memory cell array M1 and selected cell unit CU2-sel in memory cell array M2 will be explained.

The initial state of selected cell units CU1-sel and CU2-sel is an erased (reset) state. Also, the reset state is a high-resistance state (100 k$\Omega$ to 1 M$\Omega$), and the set state is a low-resistance state (1 to 10 k$\Omega$).

Selected conductive line L2($i$) is connected to power supply potential Vdd on a high-potential side, and selected conductive lines L1($j$) and L3($j$) are connected to power supply potential Vss on a low-potential side.

Also, among the first conductive lines from the semiconductor substrate, unselected conductive lines L1($j$−1) and L1($j$+1) except for selected conductive line L1($j$) are connected to power supply potential Vdd.

Among the second conductive lines from the semiconductor substrate, unselected conductive line L2($i$+1) except for selected conductive line L2($i$) is connected to power supply potential Vss.

Furthermore, among the unselected third conductive lines from the semiconductor substrate, unselected conductive lines L3($j$−1) and L3($j$+1) except for selected conductive line L3($j$) are connected to power supply potential Vdd.

In this state, a forward bias is applied to the rectifying elements (diodes) in selected cell units CU1-sel and CU2-sel, a set current I-set from a constant current source flows through selected cell units CU1-sel and CU2-sel, and the resistance value of the memory elements in selected cell units CU1-sel and CU2-sel changes from the high-resistance state to the low-resistance state.

In the set operation, a voltage of 1 to 2 V is applied to the memory elements in selected cell units CU1-sel and CU2-sel, and the current density of the set current I-set to be supplied to these memory cells (the high-resistance state) is set within the range of $1 \times 10^5$ to $1 \times 10^7$ A/cm$^2$.

On the other hand, among unselected cell units CU1-unsel in memory cell array M1, a reverse bias is applied to the rectifying elements (diodes) in cell units connected between unselected conductive line L2($i$+1) and unselected conductive lines L1($j$−1) and L1($j$+1).

Likewise, among unselected cell units CU2-unsel in memory cell array M2, the reverse bias is applied to the rectifying elements (diodes) in cell units connected between unselected conductive line L2($i$+1) and unselected conductive lines L3($j$−1) and L3($j$+1).

Also, among unselected cell units CU1-unsel in memory cell array M1, no bias is applied to the rectifying elements (diodes) in cell units connected between selected conductive line L2($i$) and unselected conductive lines L1($j$−1) and L1($j$+1), and to the rectifying element (diode) in a cell unit connected between unselected conductive line L2($i$+1) and selected conductive line L1($j$).

Similarly, among unselected cell units CU2-unsel in memory cell array M2, no bias is applied to the rectifying elements (diodes) in cell units connected between selected conductive line L2($i$) and unselected conductive lines L3($j$−1) and L3($j$+1), and to the rectifying element (diode) in a cell unit connected between unselected conductive line L2($i$+1) and selected conductive line L3($j$).

Accordingly, no set operation is performed for the memory elements in unselected cell units CU1-unsel and CU2-unsel.

B. Reset Operation

An erase (reset) operation performed for selected cell unit CU1-sel in memory cell array M1 and selected cell unit CU2-sel in memory cell array M2 will be explained.

Selected conductive line L2($i$) is connected to power supply potential Vdd on the high-potential side, and selected conductive lines L1($j$) and L3($j$) are connected to power supply potential Vss on the low-potential side.

Also, among the first conductive lines from the semiconductor substrate, unselected conductive lines L1($j$−1) and L1($j$+1) except for selected conductive line L1($j$) are connected to power supply potential Vdd.

Among the second conductive lines from the semiconductor substrate, unselected conductive line L2($i$+1) except for selected conductive line L2($i$) is connected to power supply potential Vss.

Furthermore, among the unselected third conductive lines from the semiconductor substrate, unselected conductive lines L3($j$−1) and L3($j$+1) except for selected conductive line L3($j$) are connected to power supply potential Vdd.

In this state, the forward bias is applied to the rectifying elements (diodes) in selected cell units CU1-sel and CU2-sel, a reset current I-reset from the constant current source flows through selected cell units CU1-sel and CU2-sel, and the resistance value of the memory elements in selected cell units CU1-sel and CU2-sel changes from the low-resistance state to the high-resistance state.

In the reset operation, a voltage of 1 to 3 V is applied to the memory elements in selected cell units CU1-sel and CU2-sel, and the current density of the reset current I-reset to be supplied to these memory cells (the low-resistance state) is set within the range of $1 \times 10^3$ to $1 \times 10^6$ A/cm$^2$.

On the other hand, among unselected cell units CU1-unsel in memory cell array M1, the reverse bias is applied to the rectifying elements (diodes) in cell units connected between unselected conductive line L2($i$+1) and unselected conductive lines L1($j$−1) and L1($j$+1).

Likewise, among unselected cell units CU2-unsel in memory cell array M2, the reverse bias is applied to the rectifying elements (diodes) in cell units connected between unselected conductive line L2($i$+1) and unselected conductive lines L3($j$−1) and L3($j$+1).

Also, among unselected cell units CU1-unsel in memory cell array M1, no bias is applied to the rectifying elements (diodes) in cell units connected between selected conductive line L2($i$) and unselected conductive lines L1($j$−1) and L1($j$+1), and to the rectifying element (diode) in a cell unit connected between unselected conductive line L2($i$+1) and selected conductive line L1($j$).

Similarly, among unselected cell units CU2-unsel in memory cell array M2, no bias is applied to the rectifying elements (diodes) in cell units connected between selected conductive line L2(*i*) and unselected conductive lines L3(*j*−1) and L3(*j*+1), and to the rectifying element (diode) in a cell unit connected between unselected conductive line L2(*i*+1) and selected conductive line L3(*j*).

Accordingly, no reset operation is performed for the memory elements in unselected cell units CU1-unsel and CU2-unsel.

Note that set currents I-set and reset current I-reset are different. Note also that the values of voltages to be applied to the memory elements in selected cell units CU1-sel and CU2-sel in order to generate these electric currents depend on the material forming the memory elements.

C. Read Operation

A read operation performed for selected cell unit CU1-sel in memory cell array M1 and selected cell unit CU2-sel in memory cell array M2 will be explained below.

Selected conductive line L2(*i*) is connected to power supply potential Vdd on the high-potential side, and selected conductive lines L1(*j*) and L3(*j*) are connected to power supply potential Vss on the low-potential side.

Also, among the first conductive lines from the semiconductor substrate, unselected conductive lines L1(*j*−1) and L1(*j*+1) except for selected conductive line L1(*j*) are connected to power supply potential Vdd.

Among the second conductive lines from the semiconductor substrate, unselected conductive line L2(*i*+1) except for selected conductive line L2(*i*) is connected to power supply potential Vss.

Furthermore, among the unselected third conductive lines from the semiconductor substrate, unselected conductive lines L3(*j*−1) and L3(*j*+1) except for selected conductive line L3(*j*) are connected to power supply potential Vdd.

In this state, the forward bias is applied to the rectifying elements (diodes) in selected cell units CU1-sel and CU2-sel. Therefore, a read current I-read from the constant current source flows through the memory elements (the high- or low-resistance state) in selected cell units CU1-sel and CU2-sel.

Accordingly, data (the resistance value) of a memory element can be read by detecting the potential change of a sense node when read current I-read flows through the memory element.

Note that the value of read current I-read must be much smaller than those of set current I-set and reset current I-reset, so that the resistance value of the memory element does not change during the read operation.

In the read operation, as in the set/reset operations, among unselected cell units CU1-unsel in memory cell array M1, the reverse bias is applied to the rectifying elements (diodes) in cell units connected between unselected conductive line L2(*i*+1) and unselected conductive lines L1(*j*−1) and L1(*j*+1).

Likewise, among unselected cell units CU2-unsel in memory cell array M2, the reverse bias is applied to the rectifying elements (diodes) in cell units connected between unselected conductive line L2(*i*+1) and unselected conductive lines L3(*j*−1) and L3(*j*+1).

Also, among unselected cell units CU1-unsel in memory cell array M1, no bias is applied to the rectifying element (diode) in cell units connected between selected conductive line L2(*i*) and unselected conductive lines L1(*j*−1) and L1(*j*+1), and to the rectifying element (diode) in a cell unit connected between unselected conductive line L2(*i*+1) and selected conductive line L1(*j*).

Similarly, among unselected cell units CU2-unsel in memory cell array M2, no bias is applied to the rectifying elements (diodes) in cell units connected between selected conductive line L2(*i*) and unselected conductive lines L3(*j*−1) and L3(*j*+1), and to the rectifying element (diode) in a cell unit connected between unselected conductive line L2(*i*+1) and selected conductive line L3(*j*).

Accordingly, no read operation is performed for the memory elements in unselected cell units CU1-unsel and CU2-unsel.

(5) Others

Methods of changing the resistance value of a memory element include a method of reversibly changing the resistance value of a memory element between at least first and second values by changing the polarity of a voltage to be applied to the memory element, and a method of reversibly changing the resistance value of a memory element between at least first and second values by controlling the magnitude and application time of a voltage to be applied to the memory element without changing the polarity of the voltage.

The former is called a bipolar operation, and the latter is called a unipolar operation.

The embodiments are directed to a driver as a peripheral circuit of a memory cell array, and hence applicable to both the bipolar and unipolar operations.

3. Relationship Between Memory Cell Array and Peripheral Circuit (Driver)

(1) Layout

FIG. 4 shows the first example of a memory cell array and peripheral circuit.

On semiconductor substrate 11, n (n is a natural number of 2 or more) memory cell arrays 2 are stacked. Note that in this example, n is an even number of 4 or more in order to simplify the explanation.

Odd-numbered conductive lines L1(*j*), ..., L(n−1)(*j*), and L(n+1)(*j*) run in the second direction, and each have one end connected to a driver (FET) Dr1(*j*) in first control circuit 3 via hookup area 14. Drivers (FETs) Dr1(*j*) are two-dimensionally formed in a limited region on semiconductor substrate 11.

Even-numbered conductive lines L2(*i*), ..., and Ln(i) run in the first direction, and each have one end connected to driver (FET) Dr2(*i*) in second control circuit 4 via hookup area 15. Drivers (FETs) Dr2(*i*) are also two-dimensionally formed in a limited region on semiconductor substrate 11.

State machine 8 manages the operations of first and second control circuits 3 and 4 based on command data.

Figure 5:
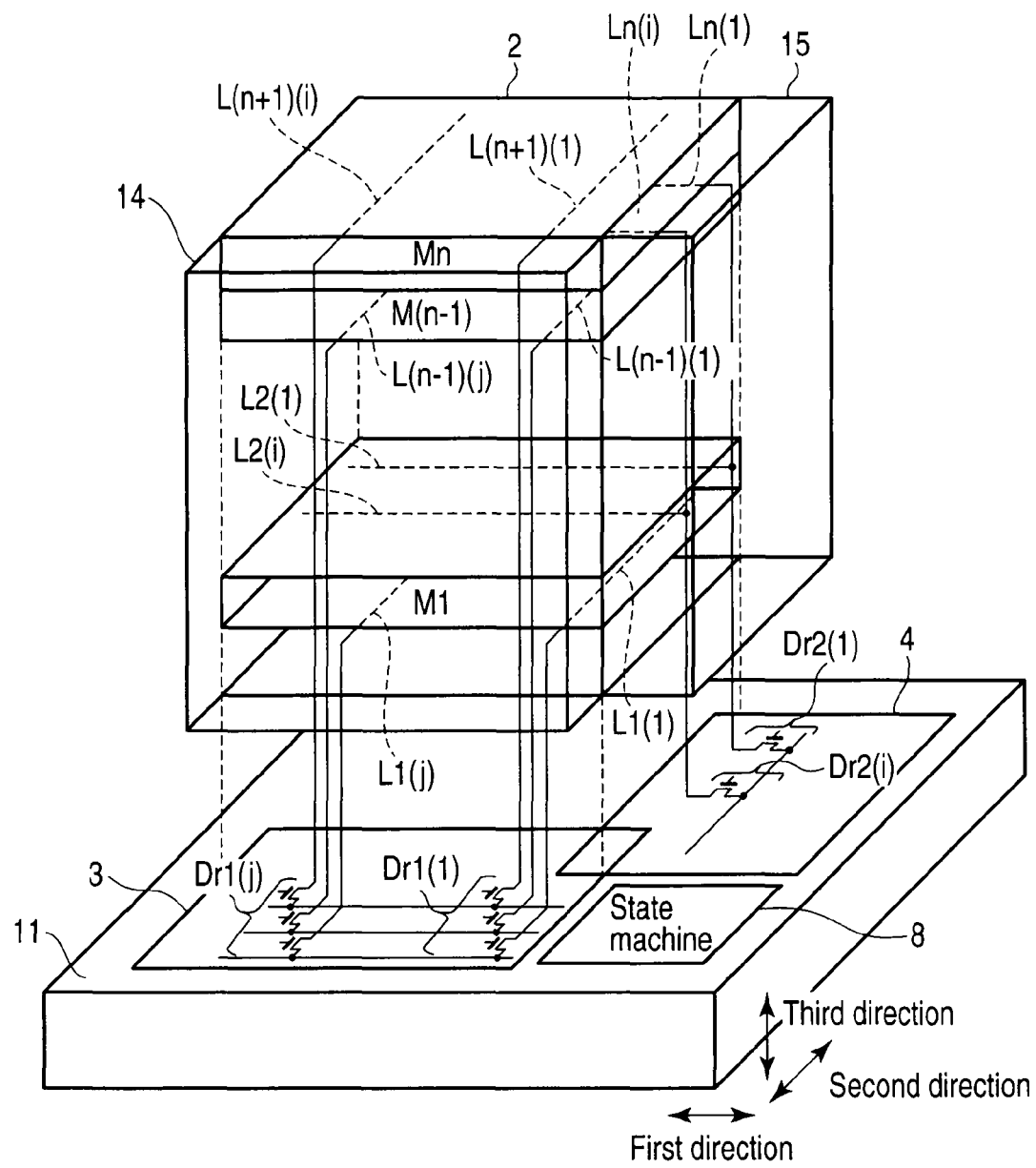

FIG. 5 shows the second example of a memory cell array and peripheral circuit.

Compared to the first example, the second example includes, as a feature, common driver (FET) Dr2(*i*) for even-numbered conductive lines L2(*i*), ..., and Ln(i).

That is, even-numbered conductive lines L2(*i*), ..., and Ln(i) run in the first direction, and each have one end connected to common driver (FET) Dr2(*i*) in second control circuit 4. Drivers (FETs) Dr2(*i*) are two-dimensionally formed in a limited region on semiconductor substrate 11.

The rest of the arrangement is the same as that of the first example, and a repetitive explanation will be omitted by using the same reference numerals as shown in FIG. 4.

(2) Device Structure

Figure 6:
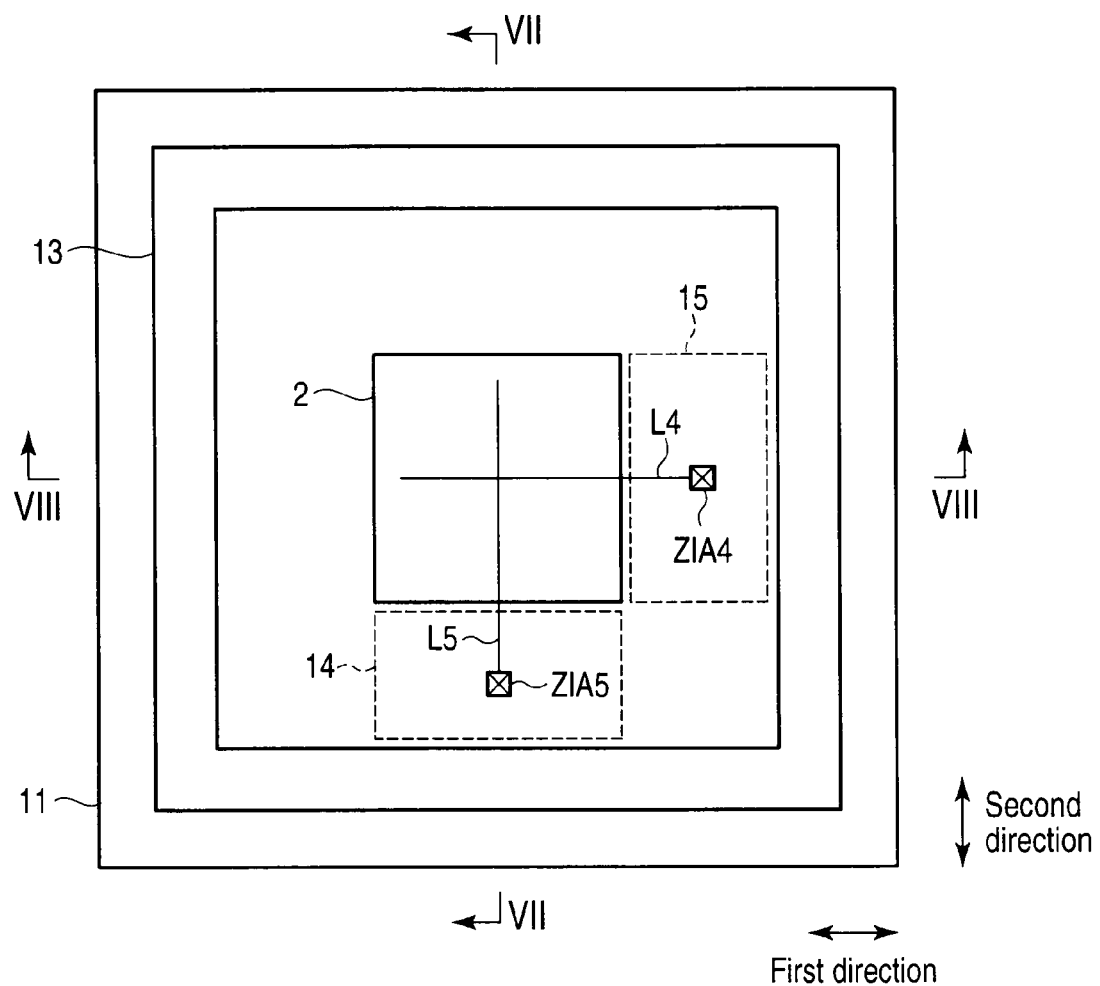
FIG. 6 shows a device structure.
Figure 8:
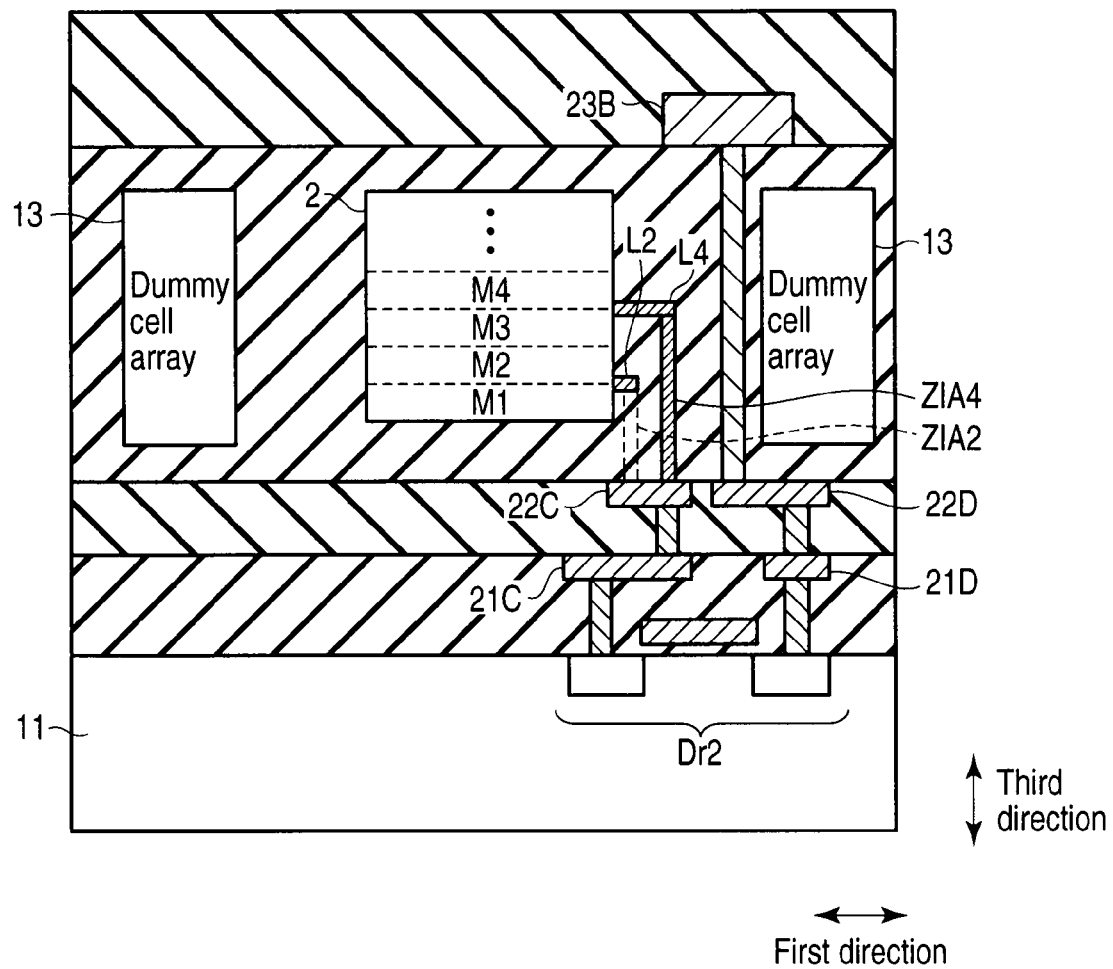
FIG. 8 is a cross-sectional view along VIII-VIII line in FIG. 6.

FIGS. 6, 7, and 8 illustrate an example of the device structure. FIG. 6 is a plan view, FIG. 7 is a sectional view taken along line VII-VII in FIG. 6, and FIG. 8 is a sectional view taken along line VIII-VIII in FIG. 6.

Drivers (FET) Dr1 and Dr2 are arranged on semiconductor substrate 11. Memory cell array 2 and dummy cell array 13 are arranged above semiconductor substrate 11.

Dummy cell array 13 surrounds memory cell array 2. Dummy cell array 13 has the same structure as that of memory cell array 2, and is formed to planarize the upper surface of an insulating layer on memory cell array 2.

Odd-numbered conductive lines L1, L3, L5, . . . from semiconductor substrate 11 will be explained.

Fifth conductive line L5 from semiconductor substrate 11 runs in the second direction, and functions as an upper conductive line of memory cell array M4. One end of conductive line L5 is connected to via plug ZIA5 in hookup area 14. Via plug ZIA5 connects conductive lines 22A and L5. Conductive line 22A is connected to one terminal of driver Dr1 via conductive line 21A. The other terminal of driver Dr1 is connected to conductive line 23A via conductive lines 21B and 22B.

Third conductive line L3 from semiconductor substrate 11 runs in the second direction, and functions as an upper conductive line of memory cell array M2 and a lower conductive line of memory cell array M3. One end of conductive line L3 is connected to via plug ZIA3. First conductive line L1 from semiconductor substrate 11 runs in the second direction, and functions as a lower conductive line of memory cell array M1. One end of conductive line L1 is connected to via plug ZIA1.

Even-numbered conductive lines L2, L4, . . . from semiconductor substrate 11 will be explained.

Fourth conductive line L4 from semiconductor substrate 11 runs in the first direction, and functions as an upper conductive line of memory cell array M3 and a lower conductive line of memory cell array M4. One end of conductive line L4 is connected to via plug ZIA4 in hookup area 15. Via plug ZIA4 connects conductive lines 22C and L4. Conductive line 22C is connected to one terminal of driver Dr2 via conductive line 21C. The other terminal of driver Dr2 is connected to conductive line 23B via conductive lines 21D and 22D.

Second conductive line L2 from semiconductor substrate 11 runs in the first direction, and functions as an upper conductive line of memory cell array M1 and a lower conductive line of memory cell array M2. One end of conductive line L2 is connected to via plug ZIA2.

Conductive lines 21A to 21D and 22A to 22D are generally made of a metal material such as aluminum or copper, and desirably made of a refractory metal such as tungsten so as to withstand high-temperature processes.

Analogously, conductive lines L1, L2, L3, L4, L5, . . . and via plugs ZIA1, ZIA2, ZIA3, ZIA4, ZIA5, . . . in memory cell arrays M1, M2, M3, M4, . . . are desirably made of a refractory metal such as tungsten.

Conductive lines 23A and 23B on memory cell array 2 can be made of a metal material such as aluminum or copper, and can also be made of a refractory metal such as tungsten.

(3) Structures of Memory Cell Array and Via Plug

Figure 9:
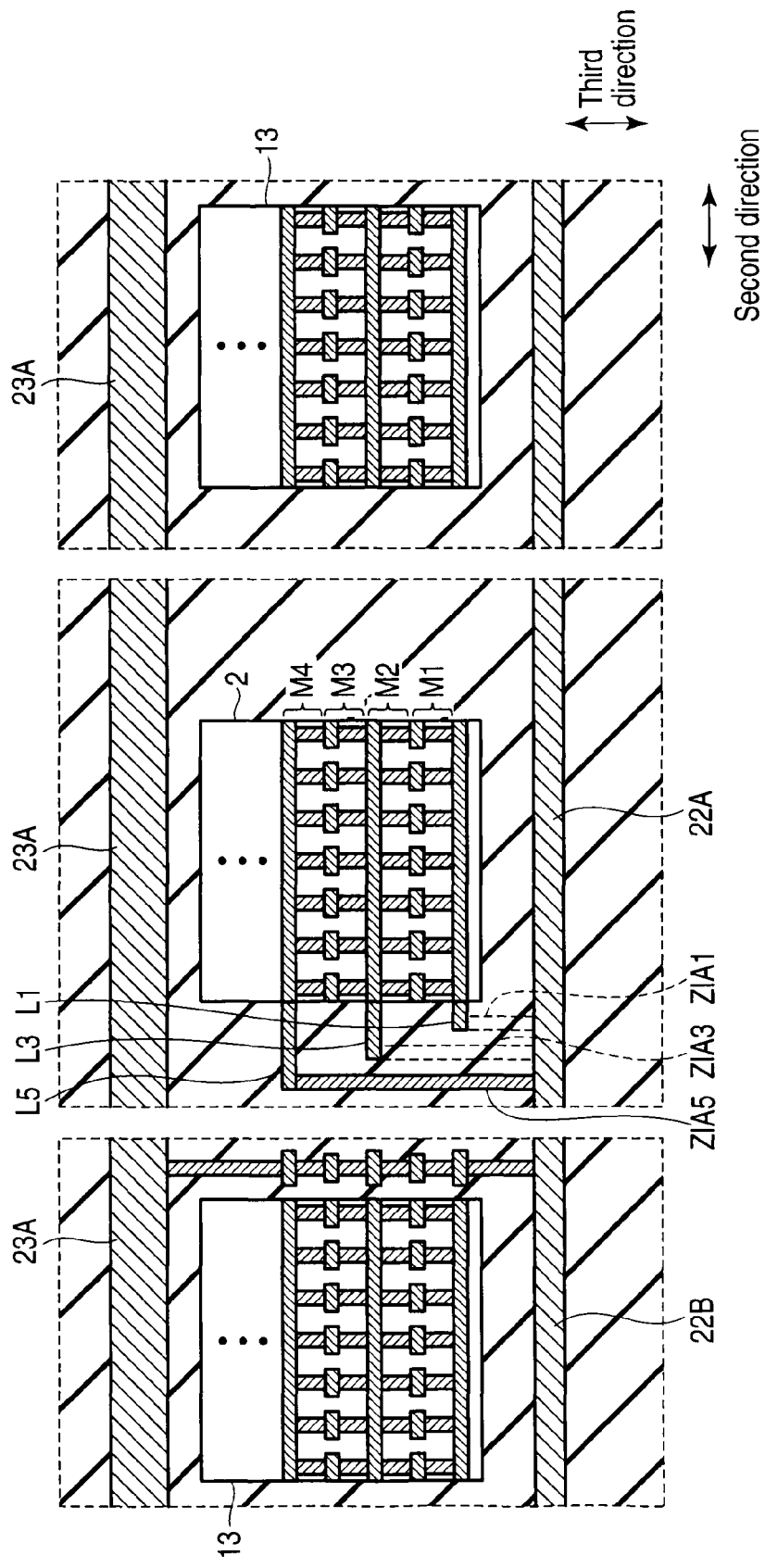
FIG. 9 is a cross-sectional view in a second direction of an array.
Figure 10:
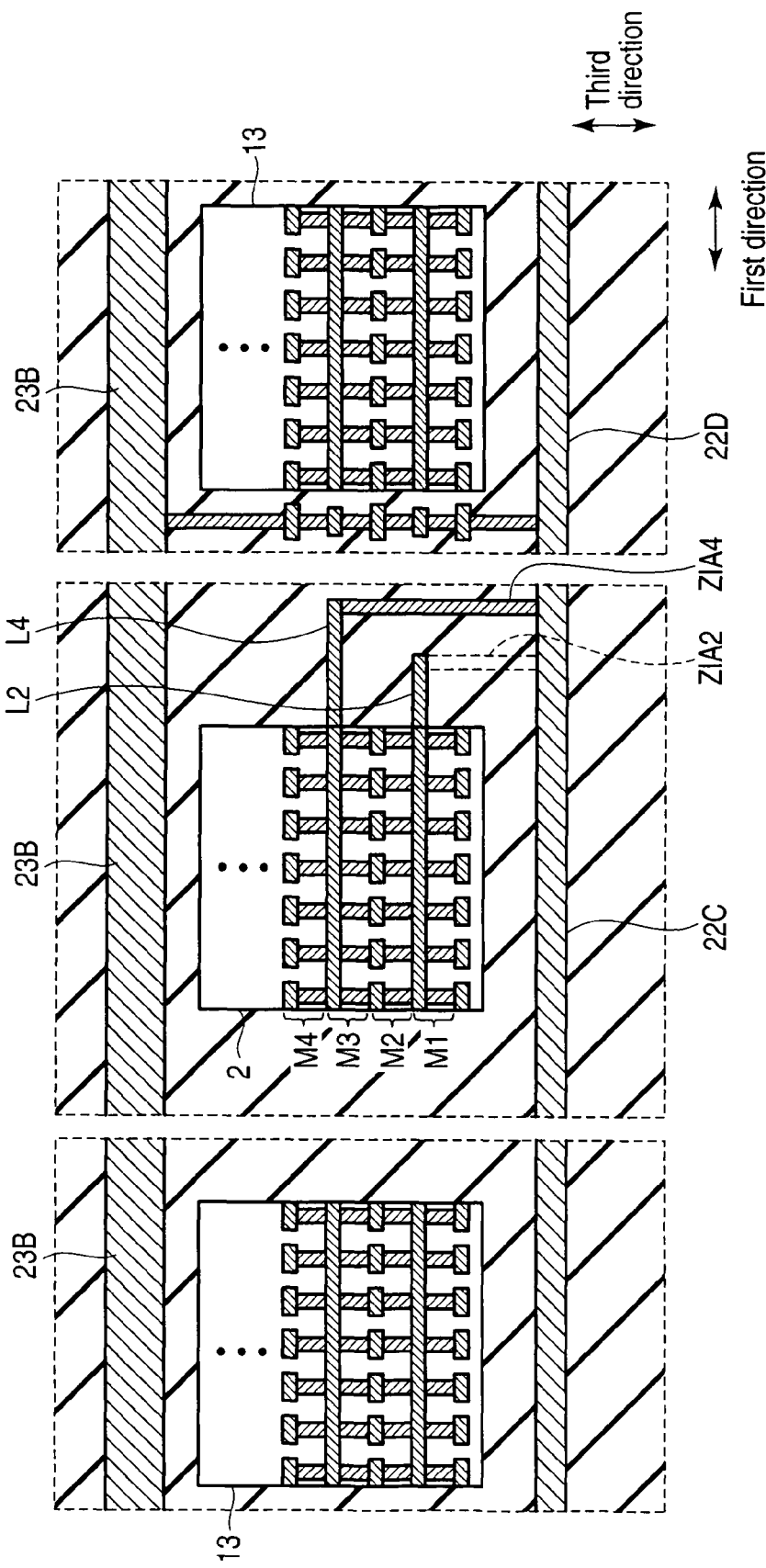
FIG. 10 is a cross-sectional view in a first direction of the array.

FIGS. 9 and 10 illustrate details of the structure of the memory cell array. FIG. 9 is a sectional view of the memory cell array in the second direction, and FIG. 10 is a sectional view of the memory cell array in the first direction.

In FIGS. 9 and 10, the same reference numerals as in FIGS. 6, 7, and 8 denote the same elements.

Via plugs ZIA1, ZIA2, ZIA3, ZIA4, ZIA5, . . . connecting conductive lines L1, L2, L3, L4, L5, . . . in memory cell array 2 and conductive lines 22A and 22C will be explained below.

The positions (reference points) of the bottom surfaces of all via plugs ZIA1, ZIA2, ZIA3, ZIA4, ZIA5, . . . are the same. Also, the lengths of via plugs ZIA1, ZIA2, ZIA3, ZIA4, ZIA5, . . . in the third direction gradually increase from via plug ZIA1 connected to conductive line L1 toward the via plug connected to the uppermost conductive line.

Accordingly, assuming that via plugs ZIA1, ZIA2, ZIA3, ZIA4, ZIA5, . . . have the same structure, time constants τ (=resistance values R×capacitance values C) of these via plugs gradually increase from via plug ZIA1 toward the via plug connected to the uppermost conductive line.

As shown in FIG. 11, therefore, the sizes of the first to (n+1)-th drivers for driving conductive lines L1, L2, . . . , and L(n+1) gradually increase from the first driver toward the (n+1)-th driver in accordance with the increase in time constants τ of via plugs ZIA1, ZIA2, . . . , and ZIA(n+1).

Also, in a cross-point type memory cell array, the direction in which odd-numbered conductive lines L1, L3, L5, . . . run differs from the direction in which even-numbered conductive lines L2, L4, . . . run. That is, the drivers for driving odd-numbered conductive lines L1, L3, L5, . . . are collectively arranged at, e.g., one end of memory cell array 2 in the second direction, and the drivers for driving even-numbered conductive lines L2, L4, . . . are collectively arranged at, e.g., one end of memory cell array 2 in the first direction.

As shown in FIG. 12, therefore, the sizes of only the drivers for driving odd-numbered conductive lines L1, L3, L5, . . . may gradually be increased in accordance with the increase in time constants τ of via plugs ZIA1, ZIA3, ZIA5, . . . .

Likewise, as shown in FIG. 13, the sizes of the drivers for driving even-numbered conductive lines L2, L4, . . . may gradually be increased in accordance with the increase in time constants τ of via plugs ZIA2, ZIA4, . . . .

By thus changing the driver sizes, it is possible to minimize the enlargement of the driver formation region with respect to the increase in number of memory cell arrays to be stacked. This makes it possible to sufficiently obtain the benefit of a large capacity of a three-dimensional memory cell array.

Conductive lines L1, L2, L3, L4, L5, . . . in memory cell array 2 are stacked at a constant pitch in the third direction. Therefore, the lengths of via plugs ZIA1, ZIA2, ZIA3, ZIA4, ZIA5, . . . in the third direction increase at a constant rate from via plug ZIA1 connected to conductive line L1 toward the via plug connected to the uppermost conductive line.

Accordingly, the sizes of the drivers for driving conductive lines L1, L2, L3, L4, L5, . . . are desirably increased at a constant rate from the driver corresponding to via plug ZIA1 toward the driver corresponding to the via plug connected to the uppermost conductive line.

For example, as shown in FIG. 14, letting τ (=resistance value R×capacitance value C) be the time constant of via plug ZIA1, time constants τ of via plugs ZIA2, ZIA3, ZIA4, . . . , and ZIA(n+1) are respectively $2^2\tau$ (=2R×2C), $3^2\tau$ (=3R×3C), $4^2\tau$ (=4R×4C), . . . , and $(n+1)^2\tau$(=(n+1)R×(n+1)C).

Accordingly, the sizes of the first to (n+1)-th drivers for driving conductive lines L1, L2, . . . , and L(n+1) are respectively set to, e.g., 1, 2, 3, 4, . . . , and (n+1) from the first driver toward the (n+1)-th driver in accordance with the increase in time constants τ of via plugs ZIA1, ZIA2, ZIA3, ZIA4, . . . , and ZIA(n+1). Note that the size of the first driver connected to via plug ZIA1 is defined as 1 (a reference value).

Also, as shown in FIG. 15, the sizes of only the drivers for driving odd-numbered conductive lines L1, L3, L5, . . . may be gradually increased like, e.g., 1, 3, 5, . . . in accordance with the increase in time constants τ of via plugs ZIA1, ZIA3, ZIA5, . . . . Note that the size of the first driver connected to via plug ZIA1 is defined as 1 (a reference value).

Similarly, as shown in FIG. 16, the sizes of only the drivers for driving even-numbered conductive lines L2, L4, . . . may be gradually increased like, e.g., 2, 4, . . . in accordance with the increase in time constants τ of via plugs ZIA2, ZIA4, . . . . Note that the size of the first driver connected to via plug ZIA1 is defined as 1 (a reference value).

4. Embodiments

Embodiments using different driver sizes will be explained below.

Figure 17:
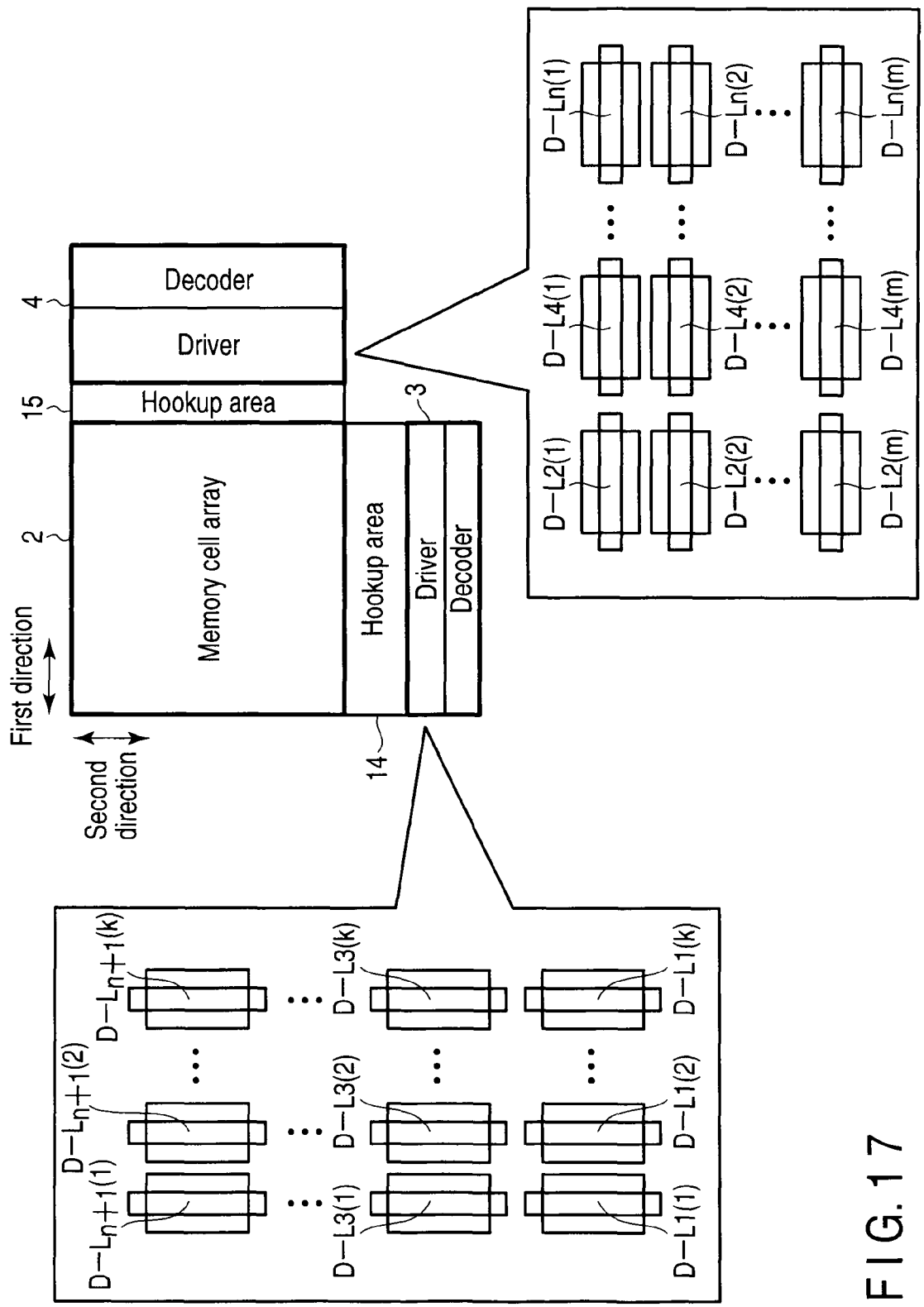
FIG. 17 shows a comparative example.

First, as a comparative example, FIG. 17 shows an example in which the sizes of all drivers are the same. First control circuit 3 is placed at one end of memory cell array 2 in the second direction, and second control circuit 4 is placed at one end of memory cell array 2 in the first direction.

Hookup area 14 is an area in which via plugs ZIA1, ZIA3, . . . shown in FIGS. 6, 7, 8, 9, and 10 are arranged.

First drivers D-L1(1), D-L1(2), . . . , and D-L1(k) drive first conductive lines L1(1), L1(2), . . . , and L1(k) from the semiconductor substrate. Third drivers D-L3(1), D-L3(2), . . . , and D-L3(k) drive third conductive lines L3(1), L3(2), . . . , and L3(k) from the semiconductor substrate.

Hookup area 15 is an area in which via plugs ZIA2, ZIA4, . . . shown in FIGS. 6, 7, 8, 9, and 10 are arranged.

Second drivers D-L2(1), D-L2(2), . . . , and D-L2(m) drive second conductive lines L2(1), L2(2), . . . , and L2(m) from the semiconductor substrate. Fourth drivers D-L4(1), D-L4(2), . . . , and D-L4(m) drive fourth conductive lines L4(1), L4(2), . . . and L4(m).

(1) First Embodiment

Figure 18:
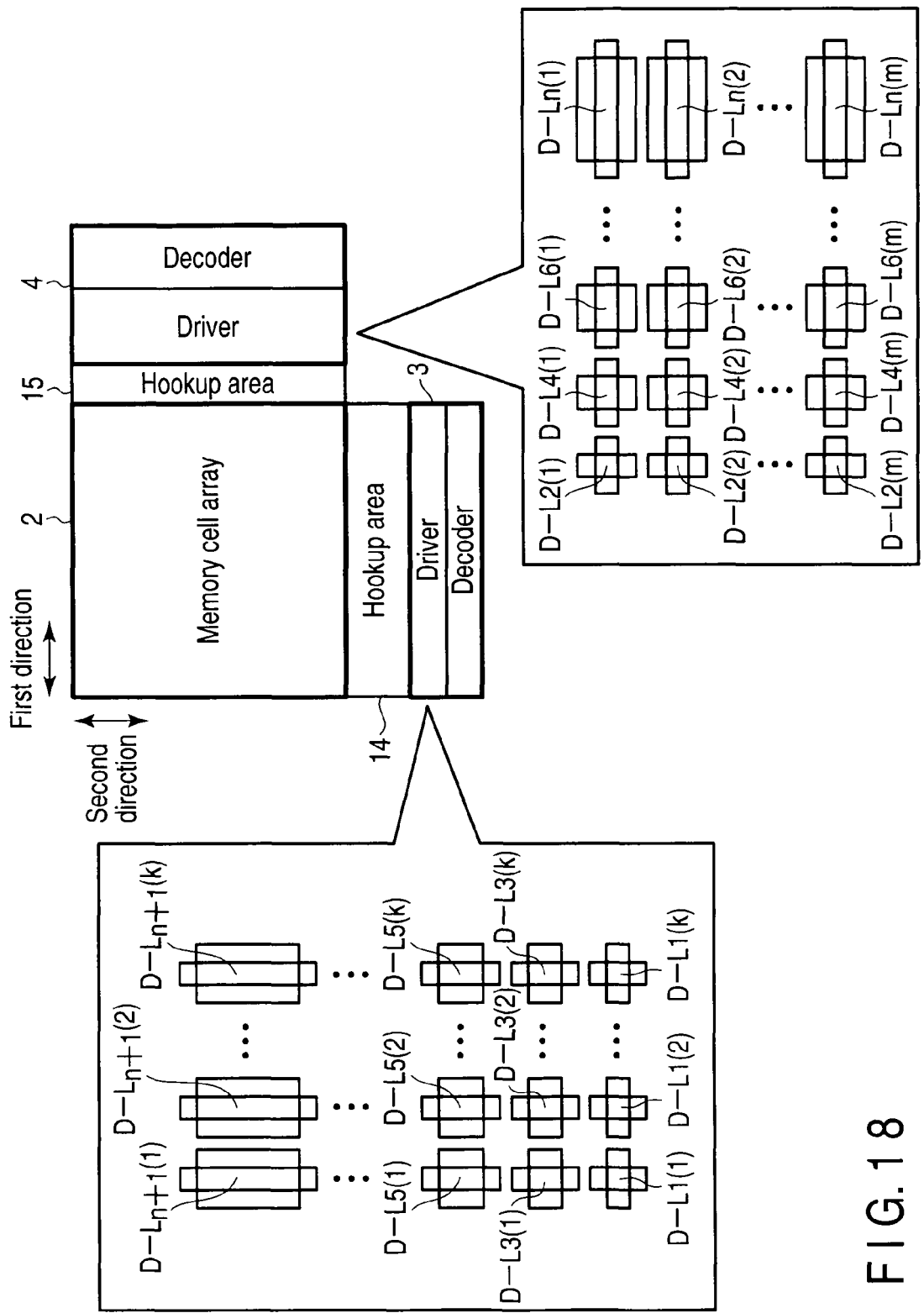
FIG. 18 shows a first embodiment.

FIG. 18 shows the first embodiment.

In FIG. 18, the same reference numerals as in FIG. 17 denote the same elements.

According to the feature of this embodiment, when a memory cell array has a stacked layer structure including first conductive lines, first variable resistance elements, second conductive lines, second variable resistance elements, . . . , n-th conductive lines, n-th variable resistance elements, and (n+1)-th conductive lines (n is a natural number of 2 or more), the sizes of first to (n+1)-th drivers for driving the first to (n+1)-th conductive lines are as follows.

[D-L1(1), D-L1(2), . . . , D-L1(k)]<[D-L2(1), D-L2(2), . . . , D-L2(m)]<[D-L3(1), D-L3(2), . . . , D-L3(k)]< [D-L4(1), D-L4(2), . . . , D-L4(m)]< . . . <[D-Ln(1), D-Ln(2), . . . , D-Ln(m)]<[D-Ln+1(1), D-Ln+1(2), . . . , D-Ln+1(k)]

Note that D-L1(1), D-L1(2), . . . , and D-L1(k) are first drivers for driving first conductive lines L1(1), L1(2), . . . , and L1(k) from the semiconductor substrate. D-L2(1), D-L2(2), . . . , and D-L2(m) are second drivers for driving second conductive lines L2(1), L2(2), . . . , and L2(m) from the semiconductor substrate.

D-L3(1), D-L3(2), . . . , and D-L3(k) are third drivers for driving third conductive lines L3(1), L3(2), . . . , and L3(k) from the semiconductor substrate. D-L4(1), D-L4(2), . . . , and D-L4(m) are fourth drivers for driving fourth conductive lines L4(1), L4(2), . . . , and L4(m) from the semiconductor substrate.

D-Ln(1), D-Ln(2), . . . , and D-Ln(m) are n-th drivers for driving n-th conductive lines Ln(1), Ln(2), . . . , and Ln(m) from the semiconductor substrate. D-Ln+1(1), D-Ln+1(2), . . . , and D-Ln+1(k) are (n+1)-th drivers for driving (n+1)-th conductive lines Ln+1(1), Ln+1(2), . . . , and Ln+1(k) from the semiconductor substrate.

In this case, k is the number of odd-numbered conductive lines arranged in the first direction, and m is the number of even-numbered conductive lines arranged in the second direction. Each of k and m is a natural number of 2 or more, and k and m can be the same number or different numbers.

(2) Second Embodiment

Figure 19:
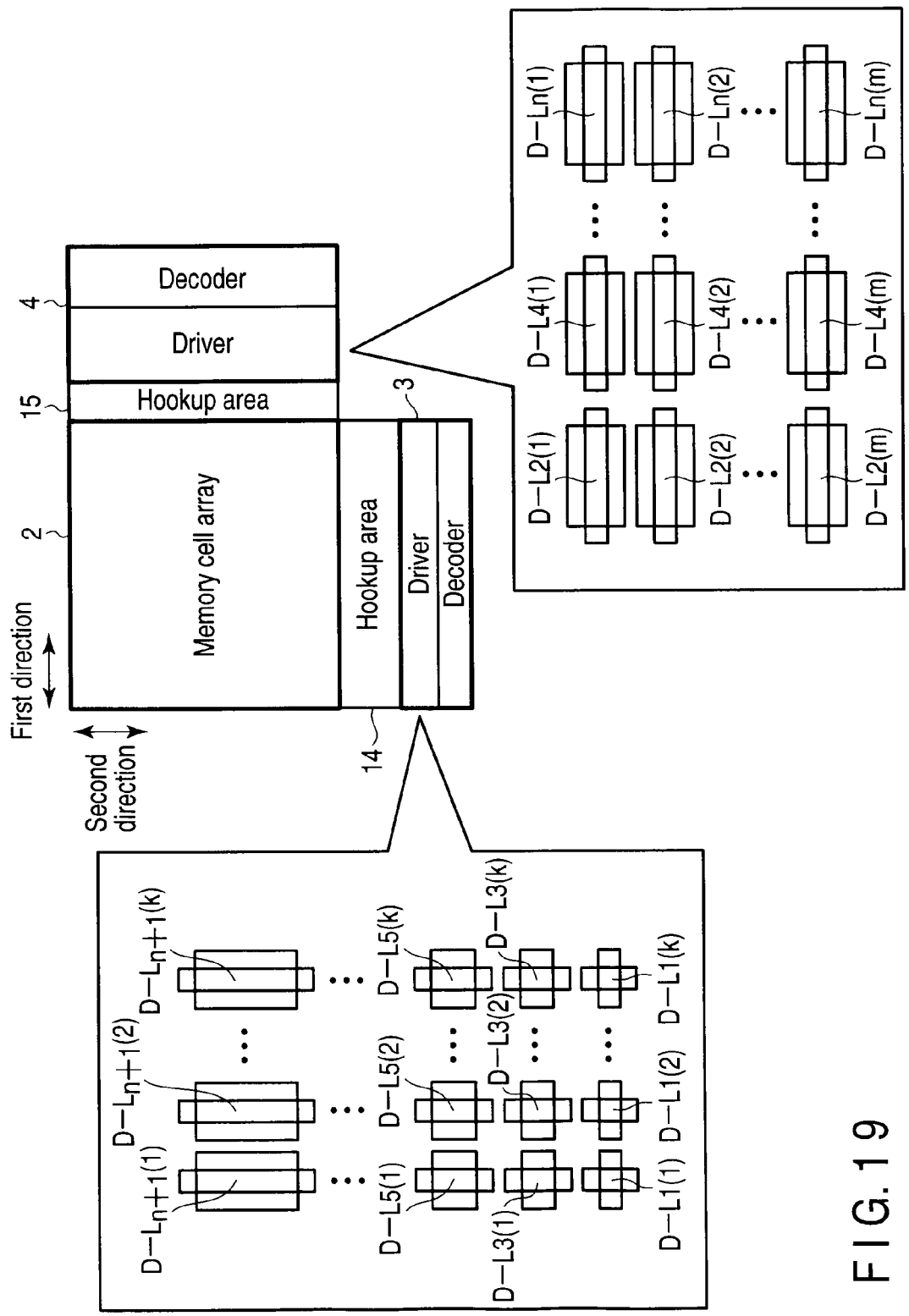
FIG. 19 shows a second embodiment.

FIG. 19 shows the second embodiment.

In FIG. 19, the same reference numerals as in FIG. 17 denote the same elements.

According to the feature of this embodiment, when a memory cell array has a stacked layer structure including first conductive lines, first variable resistance elements, second conductive lines, second variable resistance elements, . . . , n-th conductive lines, n-th variable resistance elements, and (n+1)-th conductive lines (n is a natural number of 2 or more), the sizes of drivers for driving odd-numbered conductive lines are as follows from first drivers toward drivers for driving uppermost conductive lines among the odd-numbered conductive lines.

[D-L1(1), D-L1(2), . . . , D-L1(k)]<[D-L3(1), D-L3(2), . . . , D-L3(k)]< . . . <[D-Ln+1(1), D-Ln+1(2), . . . , D-Ln+1(k)]

Note that D-L1(1), D-L1(2), . . . , and D-L1(k) are first drivers for driving first conductive lines L1(1), L1(2), . . . , and L1(k) from the semiconductor substrate. D-L3(1), D-L3(2), . . . , and D-L3(k) are third drivers for driving third conductive lines L3(1), L3(2), . . . , and L3(k) from the semiconductor substrate. D-Ln+1(1), D-Ln+1(2), . . . , and D-Ln+1(k) are (n+1)-th drivers for driving (n+1)-th conductive lines Ln+1(1), Ln+1(2), . . . , and Ln+1(k) from the semiconductor substrate.

In this case, k is the number of odd-numbered conductive lines arranged in the first direction, and is a natural number of 2 or more.

(3) Third Embodiment

Figure 20:
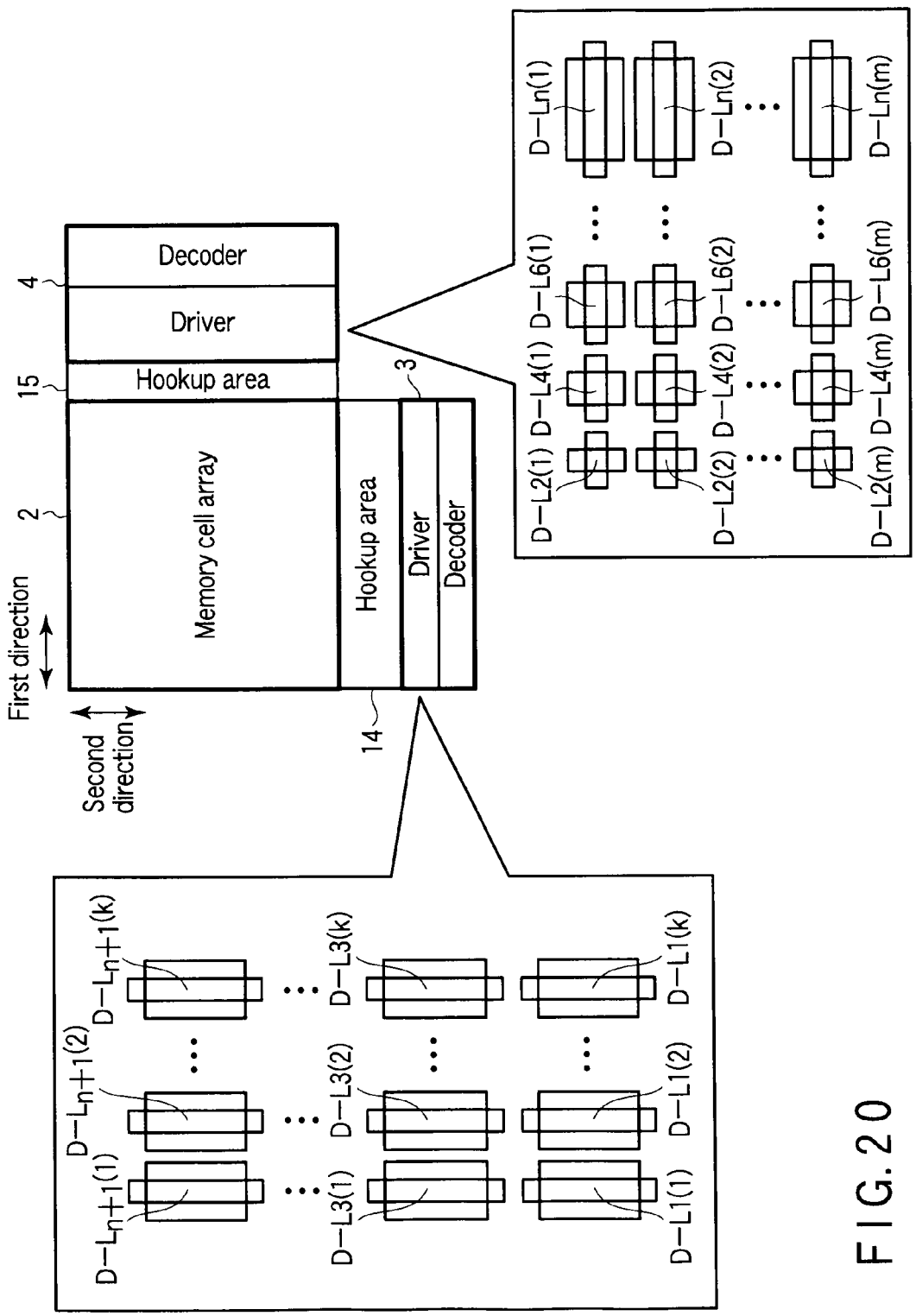
FIG. 20 shows a third embodiment.

FIG. 20 shows the third embodiment.

In FIG. 20, the same reference numerals as in FIG. 17 denote the same elements.

According to the feature of this embodiment, when a memory cell array has a stacked layer structure including first conductive lines, first variable resistance elements, second conductive lines, second variable resistance elements, . . . , n-th conductive lines, n-th variable resistance elements, and (n+1)-th conductive lines (n is a natural number of 2 or more), the sizes of drivers for driving even-numbered conductive lines are as follows from second drivers toward drivers for driving uppermost conductive lines among the even-numbered conductive lines.

[D-L2(1), D-L2(2), . . . , D-L2(m)]<[D-L4(1), D-L4(2), . . . , D-L4(m)]< . . . <[D-Ln(1), D-Ln(2), . . . , D-Ln(m)]

Note that D-L2(1), D-L2(2), . . . , and D-L2(m) are second drivers for driving second conductive lines L2(1), L2(2), . . . , and L2(m) from the semiconductor substrate. D-L4(1), D-L4(2), . . . , and D-L4(m) are fourth drivers for driving fourth conductive lines L4(1), L4(2), . . . , and L4(m) from the semiconductor substrate. D-Ln(1), D-Ln(2), . . . , and D-Ln(m) are n-th drivers for driving n-th conductive lines Ln(1), Ln(2), . . . , and Ln(m) from the semiconductor substrate.

In this case, m is the number of even-numbered conductive lines arranged in the second direction, and is a natural number of 2 or more.

(4) Fourth Embodiment

Figure 21:
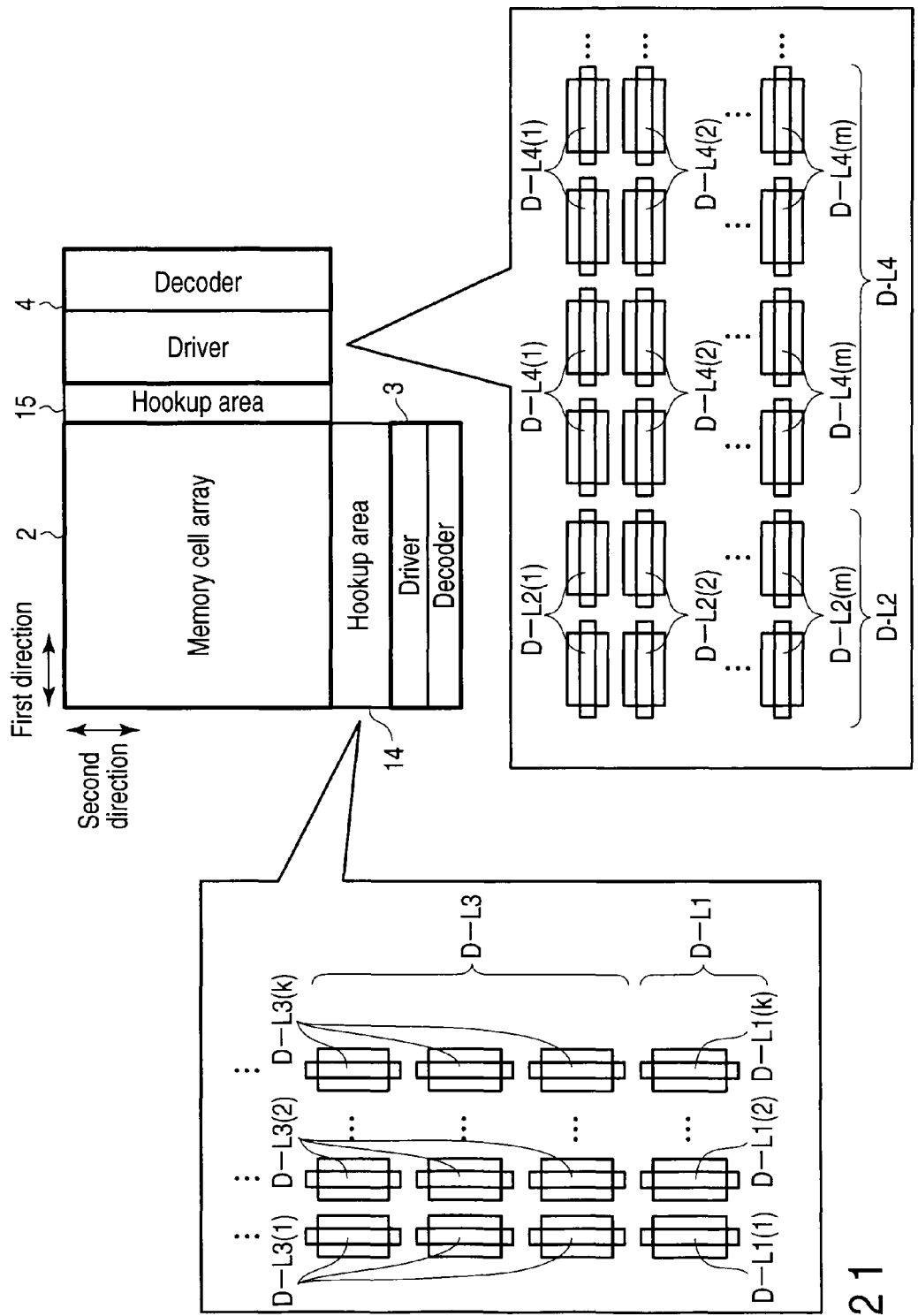
FIG. 21 shows a fourth embodiment.

FIG. 21 shows the fourth embodiment.

In FIG. 21, the same reference numerals as in FIG. 17 denote the same elements.

According to the feature of this embodiment, when a memory cell array has a stacked layer structure including first conductive lines, first variable resistance elements, second conductive lines, second variable resistance elements, . . . , n-th conductive lines, n-th variable resistance elements, and (n+1)-th conductive lines (n is a natural number of 2 or more), the sizes of first to (n+1)-th drivers for driving the first to (n+1)-th conductive lines are as follows.

$$[D-L1(1), D-L1(2), \ldots, D-L1(k)] = 1$$

$$[D-L2(1), D-L2(2), \ldots, D-L2(m)] = 2$$

-continued $$[D-L3(1), D-L3(2), \ldots, D-L3(k)] = 3$$

$$[D-L4(1), D-L4(2), \ldots, D-L4(m)] = 4$$

...

Note that D-L1(1), D-L1(2), . . . , and D-L1(k)] are first drivers for driving first conductive lines L1(1), L1(2), . . . , and L1(k) from the semiconductor substrate. D-L2(1), D-L2(2), . . . , and D-L2(m) are second drivers for driving second conductive lines L2(1), L2(2), . . . , and L2(m) from the semiconductor substrate.

D-L3(1), D-L3(2), . . . , and D-L3(k) are third drivers for driving third conductive lines L3(1), L3(2), . . . , and L3(k) from the semiconductor substrate. D-L4(1), D-L4(2), . . . , and D-L4(m) are fourth drivers for driving fourth conductive lines L4(1), L4(2), . . . , and L4(m) from the semiconductor substrate.

In this embodiment, the driver size increases at a constant rate whenever the number of conductive line layers increases by one. Therefore, FETs having a uniform size (channel width) are prepared, and the size of a driver is changed by changing the number of FETs forming the driver. That is, the number of FETs forming a driver is increased by one whenever the number of conductive line layers increases by one.

The size (channel width) of one FET is defined as 1 (a reference value).

In this case, k is the number of odd-numbered conductive lines arranged in the first direction, and m is the number of even-numbered conductive lines arranged in the second direction. Each of k and m is a natural number of 2 or more, and k and m can be the same number or different numbers.

(5) Fifth Embodiment

Figure 22:
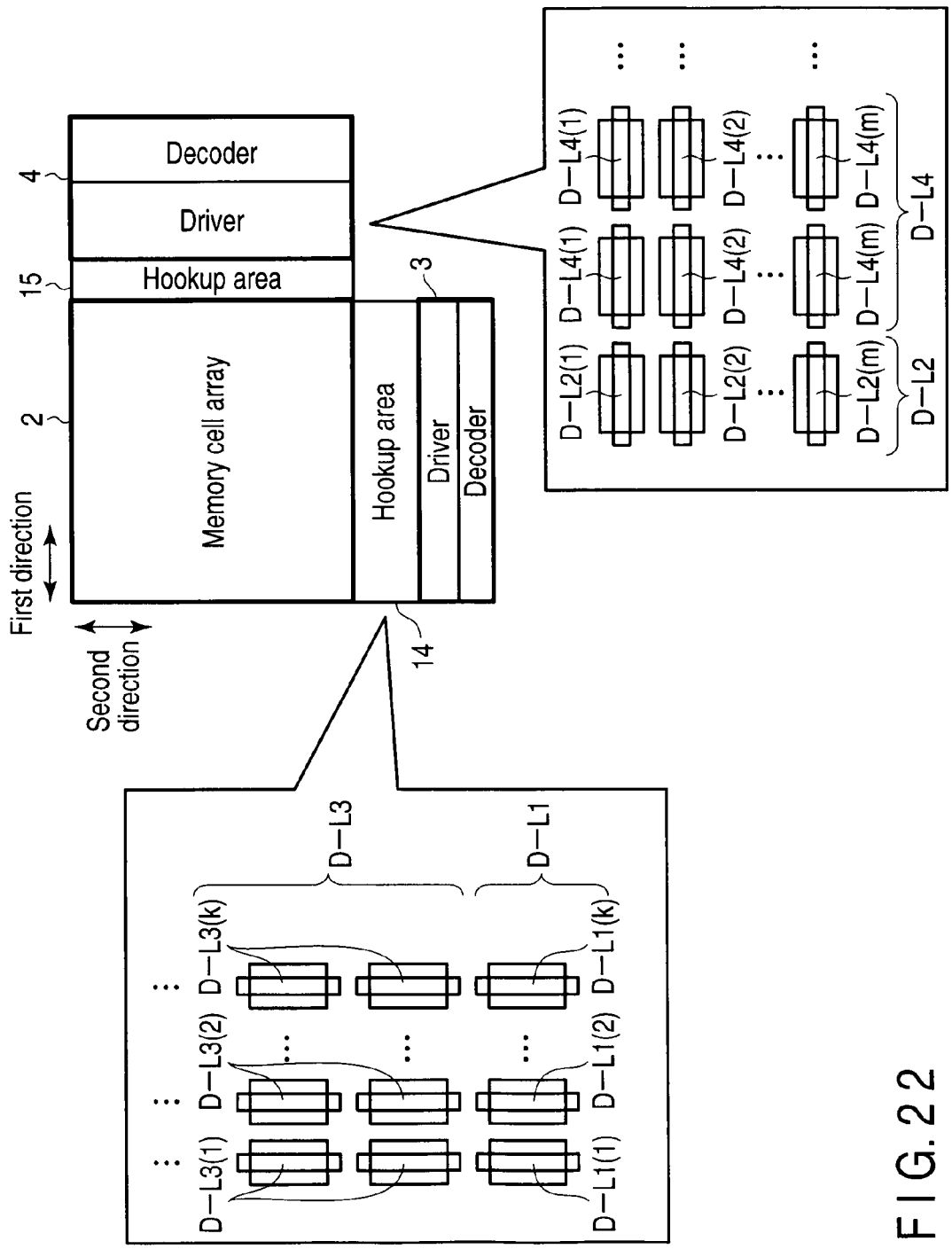
FIG. 22 shows a fifth embodiment.

FIG. 22 shows the fifth embodiment.

In FIG. 22, the same reference numerals as in FIG. 17 denote the same elements.

According to the feature of this embodiment, when a memory cell array has a stacked layer structure including first conductive lines, first variable resistance elements, second conductive lines, second variable resistance elements, . . . , n-th conductive lines, n-th variable resistance elements, and (n+1)-th conductive lines (n is a natural number of 2 or more), the sizes of first to (n+1)-th drivers for driving the first to (n+1)-th conductive lines are as follows.

[On the side of first control circuit 3]

$$[D-L1(1), D-L1(2), \ldots, \text{and } D-L1(k)] = 1 \text{ (reference value)}$$

$$[D-L3(1), D-L3(2), \ldots, \text{and } D-L3(k)] = 2$$

...

[On the side of second control circuit 4]

$$[D-L2(1), D-L2(2), \ldots, \text{and } D-L2(m)] = 1 \text{ (reference value)}$$

$$[D-L4(1), D-L4(2), \ldots, \text{and } D-L4(m)] = 2$$

...

Note that D-L1(1), D-L1(2), . . . , and D-L1(k) are first drivers for driving first conductive lines L1(1), L1(2), . . . , and L1(k) from the semiconductor substrate. D-L2(1), D-L2(2), . . . , and D-L2(m) are second drivers for driving second conductive lines L2(1), L2(2), . . . , and L2(m) from the semiconductor substrate.

D-L3(1), D-L3(2), . . . , and D-L3(k) are third drivers for driving third conductive lines L3(1), L3(2), . . . , and L3(k) from the semiconductor substrate. D-L4(1), D-L4(2), . . . , and D-L4(m) are fourth drivers for driving fourth conductive lines L4(1), L4(2), . . . , and L4(m) from the semiconductor substrate.

In this embodiment, on the side of first control circuit 3, the driver size increases at a constant rate whenever the number of conductive line layers increases by two. That is, the number of FETs forming a driver is increased by one whenever the number of conductive line layers increases by two.

Likewise, on the side of second control circuit 4, the driver size increases at a constant rate whenever the number of conductive line layers increases by two. That is, the number of FETs forming a driver is increased by one whenever the number of conductive line layers increases by two.

In this embodiment, the size (reference value=1) of one FET on the side of first control circuit 3 and the size (reference value=1) of one FET on the side of second control circuit 4 can be the same or different.

In this case, k is the number of odd-numbered conductive lines arranged in the first direction, and m is the number of even-numbered conductive lines arranged in the second direction. Each of k and m is a natural number of 2 or more, and k and m can be the same number or different numbers.

(6) Sixth Embodiment

Figure 23:
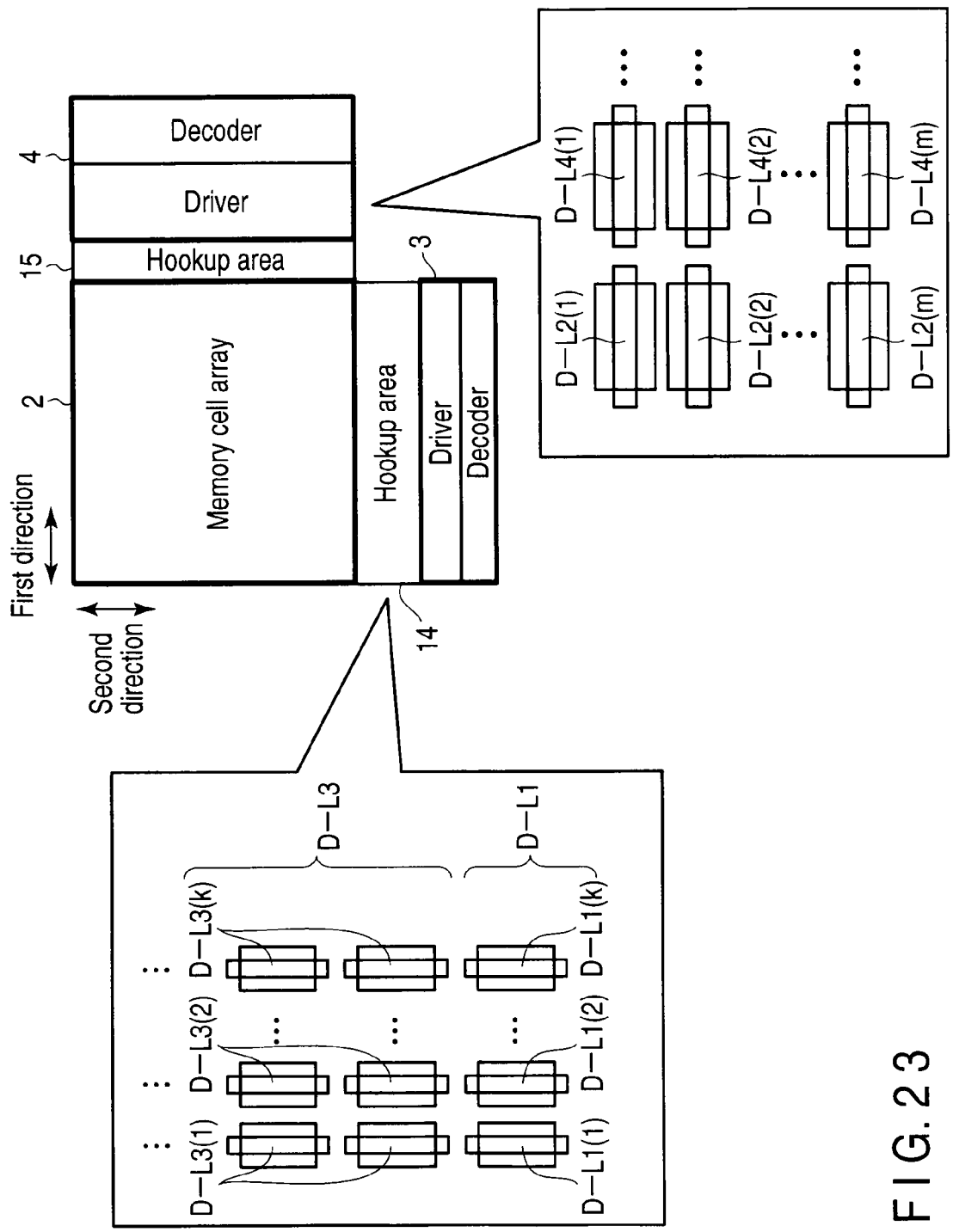
FIG. 23 shows a sixth embodiment.

FIG. 23 shows the sixth embodiment.

In FIG. 23, the same reference numerals as in FIG. 17 denote the same elements.

According to the feature of this embodiment, when a memory cell array has a stacked layer structure including first conductive lines, first variable resistance elements, second conductive lines, second variable resistance elements, . . . , n-th conductive lines, n-th variable resistance elements, and (n+1)-th conductive lines (n is a natural number of 2 or more), the sizes of drivers for driving odd-numbered conductive lines are as follows from first drivers toward drivers for driving uppermost conductive lines among the odd-numbered conductive lines.

[On the side of first control circuit 3]

$$[D-L1(1), D-L1(2), \ldots, D-L1(k)] = 1$$

$$[D-L3(1), D-L3(2), \ldots, D-L3(k)] = 2$$

...

Note that D-L1(1), D-L1(2), . . . , and D-L1(k) are first drivers for driving first conductive lines L1(1), L1(2), . . . , and L1(k) from the semiconductor substrate. D-L3(1), D-L3(2), . . . , and D-L3(k) are third drivers for driving third conductive lines L3(1), L3(2), . . . , and L3(k) from the semiconductor substrate.

In this embodiment, on the side of first control circuit 3, the driver size increases at a constant rate whenever the number of conductive line layers increases by two. That is, the number of FETs forming a driver is increased by one whenever the number of conductive line layers increases by two.

On the side of first control circuit 3, the size (channel width) of one FET is defined as 1 (a reference value), and k is the number of odd-numbered conductive lines arranged in the first direction, and is a natural number of 2 or more.

(7) Seventh Embodiment

Figure 24:
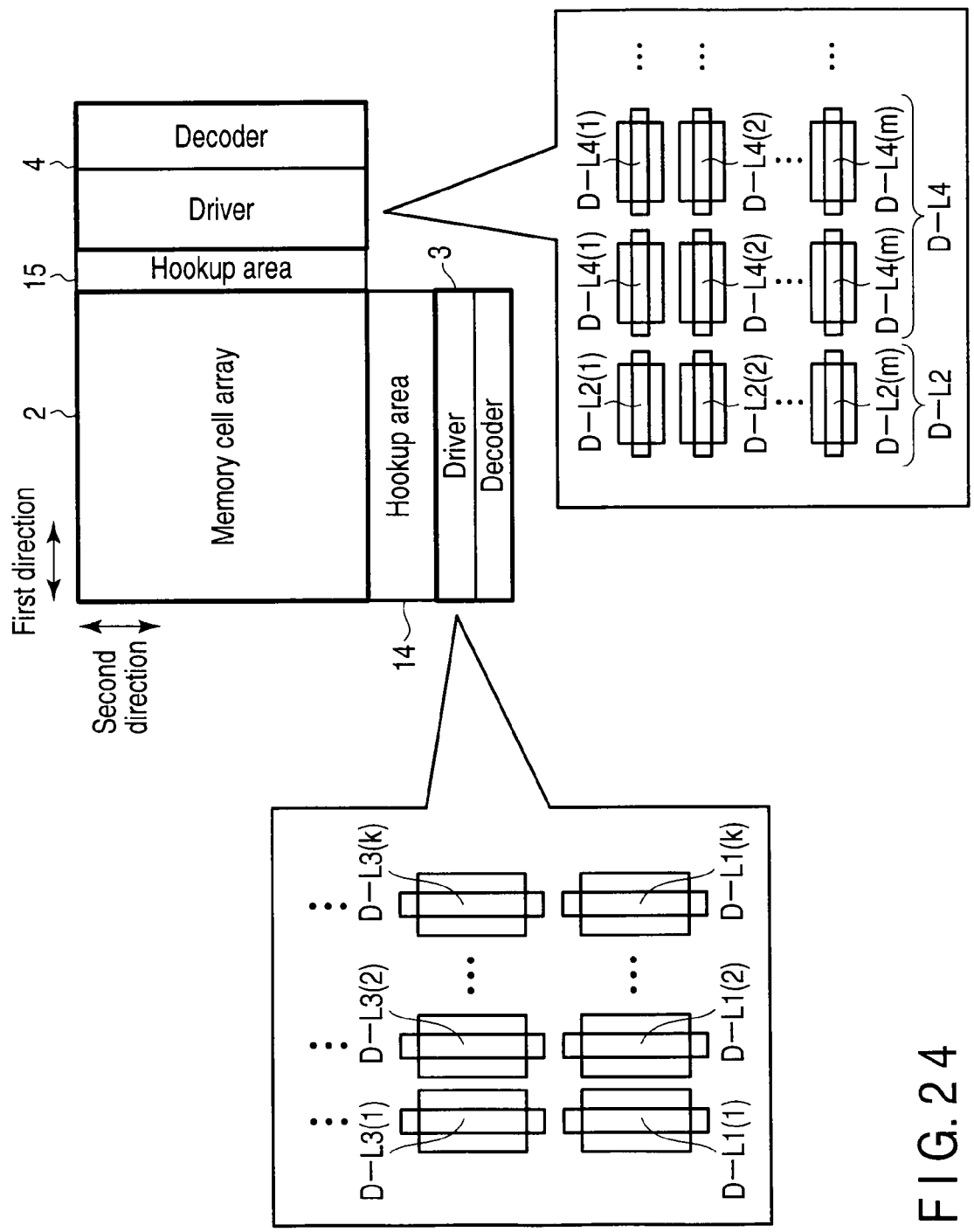
FIG. 24 shows a seventh embodiment.

FIG. 24 shows the seventh embodiment.

In FIG. 24, the same reference numerals as in FIG. 17 denote the same elements.

According to the feature of this embodiment, when a memory cell array has a stacked layer structure including first conductive lines, first variable resistance elements, second conductive lines, second variable resistance elements, . . . , n-th conductive lines, n-th variable resistance elements, and (n+1)-th conductive lines (n is a natural number of 2 or more), the sizes of drivers for driving even-numbered conductive lines are as follows from second drivers toward drivers for driving uppermost conductive lines among the even-numbered conductive lines.

[On the side of second control circuit 4]

$[D - L2(1), D - L2(2), \ldots , D - L2(m)] = 1$ $[D - L4(1), D - L4(2), \ldots , D - L4(m)] = 2$

. . .

Note that D-L2(1), D-L2(2), . . . , and D-L2($m$) are second drivers for driving second conductive lines L2(1), L2(2), . . . , and L2($m$) from the semiconductor substrate. D-L4(1), D-L4(2), . . . , and D-L4 ($m$) are fourth drivers for driving fourth conductive lines L4(1), L4(2), . . . , and L4($m$) from the semiconductor substrate.

In this embodiment, on the side of second control circuit 4, the driver size increases at a constant rate whenever the number of conductive line layers increases by two. That is, the number of FETs forming a driver is increased by one whenever the number of conductive line layers increases by two.

On the side of second control circuit 4, the size (channel width) of one FET is defined as 1 (a reference value), and m is the number of even-numbered conductive lines arranged in the first direction, and is a natural number of 2 or more.

5. Conclusion

In the embodiments, it is possible to sufficiently obtain the benefit of a large capacity of a three-dimensional memory cell array by minimizing the enlargement of the driver formation region with respect to the increase in number of memory cell arrays to be stacked.

The embodiments have great industrial merits for, e.g., a file memory capable of high-speed random writing, a portable terminal capable of high-speed downloading, a portable player capable of high-speed downloading, a semiconductor memory for a broadcasting device, a drive recorder, a home video recorder, a large-capacity buffer memory for communication, and a semiconductor memory for a surveillance camera.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions

What is claimed is:

1. A resistance change memory comprising:
a semiconductor substrate;
a stacked layer structure stacked on the semiconductor substrate in order of a first conductive line, a first variable resistance element, a second conductive line, a second variable resistance element, . . . a n-th conductive line, a n-th variable resistance element and a (n+1)-th conductive line, where n is a natural number equal to or larger than 2; and
a first to a n-th drivers which drives the first to the (n+1)-th conductive lines,
wherein the odd-numbered conductive lines from the semiconductor substrate among the first to (n+1)-th conductive lines extend in a first direction along a surface of the semiconductor substrate, the even-numbered conductive lines from the semiconductor substrate among the first to (n+1)-th conductive lines extend in a second direction along the surface of the semiconductor substrate, and the first direction intersects with the second direction,
wherein a g-th variable resistance element among the first to the n-th variable resistance elements is provided between a g-th conductive line and the (g+1)-th conductive line, where g is one of 1, 2, . . . and n,
wherein sizes of the first to (n+1)-th drivers become large gradually from the first driver to the (n+1)-th driver.

2. The memory of claim 1,
wherein the sizes of the first to (n+1)-th drivers become large at a constant rate.

3. The memory of claim 1,
wherein the sizes of the first to (n+1)-th drivers are changed by a number of FETs having the same size.

4. The memory of claim 1,
wherein the sizes of the first to (n+1)-th drivers become large corresponding to an increase of time constants of first to (n+1)-th via plugs which connect the first to (n+1)-th conductive lines with the first to (n+1)-th drivers.

5. The memory of claim 4,
wherein the first to (n+1)-th via plugs have the same structure, and lengths of the first to (n+1)-th via plugs are different from each other.

6. The memory of claim 1, further comprising
a rectifying element serial connecting to the g-th variable resistance element and providing between the g-th and (g+1)-th conductive lines.

7. A resistance change memory comprising:
a semiconductor substrate;
a stacked layer structure stacked on the semiconductor substrate in order of a first conductive line, a first variable resistance element, a second conductive line, a second variable resistance element, . . . a n-th conductive line, a n-th variable resistance element and a (n+1)-th conductive line, where n is a natural number equal to or larger than 2; and
a first to a n-th drivers which drives the first to the (n+1)-th conductive lines,
wherein the odd-numbered conductive lines from the semiconductor substrate among the first to (n+1)-th conductive lines extend in a first direction along a surface of the semiconductor substrate, the even-numbered conductive lines from the semiconductor substrate among the first to (n+1)-th conductive lines extend in a second direction along the surface of the semiconductor substrate, and the first direction intersects with the second direction, wherein a g-th variable resistance element among the first to the n-th variable resistance elements is provided between a g-th conductive line and the (g+1)-th conductive line, where g is one of 1, 2, . . . and n, wherein sizes of the drivers which drive the odd-numbered conductive lines become large gradually from the first driver to the driver which drives the uppermost conductive line among the odd-numbered conductive lines.

8. The memory of claim 7,
wherein the sizes of the drivers which drive the odd-numbered conductive lines become large at a constant rate.

9. The memory of claim 7,
wherein the sizes of the drivers which drive the odd-numbered conductive lines are changed by a number of FETs having the same size.

10. The memory of claim 7,
wherein the sizes of the drivers which drive the odd-numbered conductive lines become large corresponding to an increase of time constants of via plugs which connect the odd-numbered conductive lines with the drivers which drive the odd-numbered conductive lines.

11. The memory of claim 10,
wherein the via plugs have the same structure, and lengths of the via plugs are different from each other.

12. The memory of claim 7, further comprising
a rectifying element serial connecting to the g-th variable resistance element and providing between the g-th and (g+1)-th conductive lines.

13. A resistance change memory comprising:
a semiconductor substrate;
a stacked layer structure stacked on the semiconductor substrate in order of a first conductive line, a first variable resistance element, a second conductive line, a second variable resistance element, . . . a n-th conductive line, a n-th variable resistance element and a (n+1)-th conductive line, where n is a natural number equal to or larger than 2; and
a first to a n-th drivers which drives the first to the (n+1)-th conductive lines, wherein the odd-numbered conductive lines from the semiconductor substrate among the first to (n+1)-th conductive lines extend in a first direction along a surface of the semiconductor substrate, the even-numbered conductive lines from the semiconductor substrate among the first to (n+1)-th conductive lines extend in a second direction along the surface of the semiconductor substrate, and the first direction intersects with the second direction, wherein a g-th variable resistance element among the first to the n-th variable resistance elements is provided between a g-th conductive line and the (g+1)-th conductive line, where g is one of 1, 2, . . . and n, wherein sizes of the drivers which drive the even-numbered conductive lines become large gradually from the second driver to the driver which drives the uppermost conductive line among the even-numbered conductive lines.

14. The memory of claim 13,
wherein the sizes of the drivers which drive the even-numbered conductive lines become large at a constant rate.

15. The memory of claim 13,
wherein the sizes of the drivers which drive the even-numbered conductive lines are changed by a number of FETs having the same size.

16. The memory of claim 13,
wherein the sizes of the drivers which drive the even-numbered conductive lines become large corresponding to an increase of time constants of via plugs which connect the even-numbered conductive lines with the drivers which drive the even-numbered conductive lines.

17. The memory of claim 16,
wherein the via plugs have the same structure, and lengths of the via plugs are different from each other.

18. The memory of claim 13, further comprising
a rectifying element serial connecting to the g-th variable resistance element and providing between the g-th and (g+1)-th conductive lines.

\* \* \* \* \*